US012706159B2

(12) United States Patent
Kim et al.

(10) Patent No.: US 12,706,159 B2
(45) Date of Patent: Aug. 11, 2026

(54) NON-VOLATILE MEMORY DEVICE AND OPERATION METHOD THEREOF

(71) Applicant: SAMSUNG ELECTRONICS CO., LTD., Suwon-si (KR)

(72) Inventors: Taewan Kim, Suwon-si (KR); Hyunkook Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 169 days.

(21) Appl. No.: 18/607,850

(22) Filed: Mar. 18, 2024

(65) Prior Publication Data

US 2024/0412789 A1 Dec. 12, 2024

(30) Foreign Application Priority Data

Jun. 7, 2023 (KR) ........................ 10-2023-0073066
Jul. 19, 2023 (KR) ........................ 10-2023-0093580

(51) Int. Cl.
*G11C 16/26* (2006.01)
*G11C 16/04* (2006.01)
*G11C 16/24* (2006.01)

(52) U.S. Cl.
CPC .......... *G11C 16/26* (2013.01); *G11C 16/0483* (2013.01); *G11C 16/24* (2013.01)

(58) Field of Classification Search
CPC ....... G11C 7/1051; G11C 7/22; G11C 7/1072; G11C 7/1006; G11C 7/1066
USPC ........................................ 365/189.15, 185.18
See application file for complete search history.

(56) References Cited

U.S. PATENT DOCUMENTS 7,408,811 B2 8/2008 Shirota et al.
8,264,888 B2 9/2012 Choi et al.
10,090,046 B2 * 10/2018 Park .................... G11C 11/5642
10,204,689 B1 2/2019 Lu et al.
10,395,727 B2 8/2019 Yu et al.
11,309,030 B2 4/2022 Kamae et al.
11,527,295 B2 12/2022 Bang et al.
2012/0307561 A1 * 12/2012 Joo ........................ G11C 16/10 365/185.17
2018/0137900 A1 * 5/2018 Kim ......................... G11C 7/12
2019/0096479 A1 * 3/2019 Yu ........................... G11C 16/26
2021/0174885 A1 * 6/2021 Jia ....................... G11C 16/0483
2022/0230693 A1 * 7/2022 Chai ...................... G11C 16/32

* cited by examiner

*Primary Examiner* — Khamdan N. Alrobaie
(74) *Attorney, Agent, or Firm* — Fish & Richardson P.C.

(57) ABSTRACT

The present disclosure relates to methods of operating non-volatile memory devices. An example read operation method of a non-volatile memory device includes applying a first read voltage, generated from a voltage generator, to a selected wordline, performing a first sensing node develop operation associated with the first read voltage, and performing a first sensing operation associated with the first read voltage. While the first sensing node develop operation is performed, the voltage generator generates a second read voltage based on the selected wordline being disconnected from the voltage generator and thereby being floated.

20 Claims, 20 Drawing Sheets

Page Buffer Initialization
BL PreCharge & Dump Close 1
SO Develop 1
Sense 1
BLPH & DP2
SO Develop 2
Sense 2
BL PreCharge & Dump Close 3
Voltage
VR_I
VR_1
VR_2
VR_3
VA
VB
ta
Time
t60
t61
t62
t63
t64
t65
t66
t67
t68

Page Buffer Initialization
BL PreCharge & Dump Close 1
SO Develop 1
Sense 1
BLPH & DP2
SO Develop 2
Sense 2
BLPH & DP3
Voltage
VR_I
VR_1
VR_2
VR_3
VA
VB
Time
t60
t61
t62
t63
t64
t65
t66
t67
t68

Page Buffer Initialization
BL PreCharge & Dump Close
Verify
SO develop 1
Sense 1
SO develop 2
Sense 2
Volatage of SO
V_SO_I
Vref
V_SO_0
VSO1
VSO2
Voltage of Sel. Wordline
Vt1
VA
Sensing Latch Signal
LAT_S
t80
t81
t82
t83
t84
t85
t86
Time 130
140
V_ROW
131
Direct Enable Switch Zone
Vpre_MZ
132
Voltage Moving Zone
V_MZ
133
Decoding Zone
SSL
WLs
GSL
110
CTRL_AD
120
RADDR
120

NON-VOLATILE MEMORY DEVICE AND OPERATION METHOD THEREOF

CROSS-REFERENCE TO RELATED APPLICATIONS

This application claims priority under 35 U.S.C. § 119 to Korean Patent Application Nos. 10-2023-0073066 filed on Jun. 7, 2023, and 10-2023-0093580 filed on Jul. 19, 2023, in the Korean Intellectual Property Office, the disclosures of which are incorporated by reference herein in their entireties.

BACKGROUND

A flash memory device is being widely used as high-capacity storage of a computing system. The flash memory device performs a read operation or a program operation by controlling voltages of a plurality of wordlines connected to a plurality of memory cells. The flash memory device may perform the read operation or the program operation in units of page.

The flash memory device may perform the read operation or the program operation based on threshold voltages of memory cells. The memory cells may store data corresponding to a plurality of bits based on a plurality of program states corresponding to threshold voltage distributions. There is a need to change a voltage level of a wordline to perform the read operation or the program operation with respect to memory cells corresponding to a plurality of bitlines.

SUMMARY

The present disclosure relates to methods and devices capable of decreasing a time taken to perform an operation in a memory level operation for storing a plurality of bits.

In some implementations, a read operation method of a non-volatile memory device includes applying a first read voltage generated from a voltage generator to a selected wordline, performing a first sensing node develop operation associated with the first read voltage, and performing a first sensing operation associated with the first read voltage. While the first sensing node develop operation is performed, the voltage generator generates a second read voltage in a state where the selected wordline is disconnected from the voltage generator so as to be floated.

In some implementations, a non-volatile memory device includes a memory cell array that stores data, a voltage generator that generates first voltages necessary for an operation of the memory cell array, and direct enable switches that are located between the memory cell array and the voltage generator. While an SO develop operation associated with a first read voltage is performed, the direct enable switches disconnect a selected wordline among wordlines of the memory cell array from the voltage generator, and the voltage generator generates a second read voltage to be provided to the memory cell array.

In some implementations, a verify operation method of a non-volatile memory device includes applying a first verify voltage generated from a voltage generator to a selected wordline, performing a first sensing node develop operation associated with the first verify voltage, performing a first sensing operation associated with the first verify voltage, and performing a second sensing operation associated with the first verify voltage. While the first sensing node develop operation is performed, the voltage generator generates a second verify voltage in a state where the selected wordline is disconnected from the voltage generator so as to be floated.

BRIEF DESCRIPTION OF THE FIGURES

The above and other objects and features of the present disclosure will become apparent by describing in detail implementations thereof with reference to the accompanying drawings.

DETAILED DESCRIPTION

Hereinafter, example implementations of the present disclosure are described in detail and clearly to such an extent that an ordinary one in the art easily carries out the present disclosure.

Figure 1:
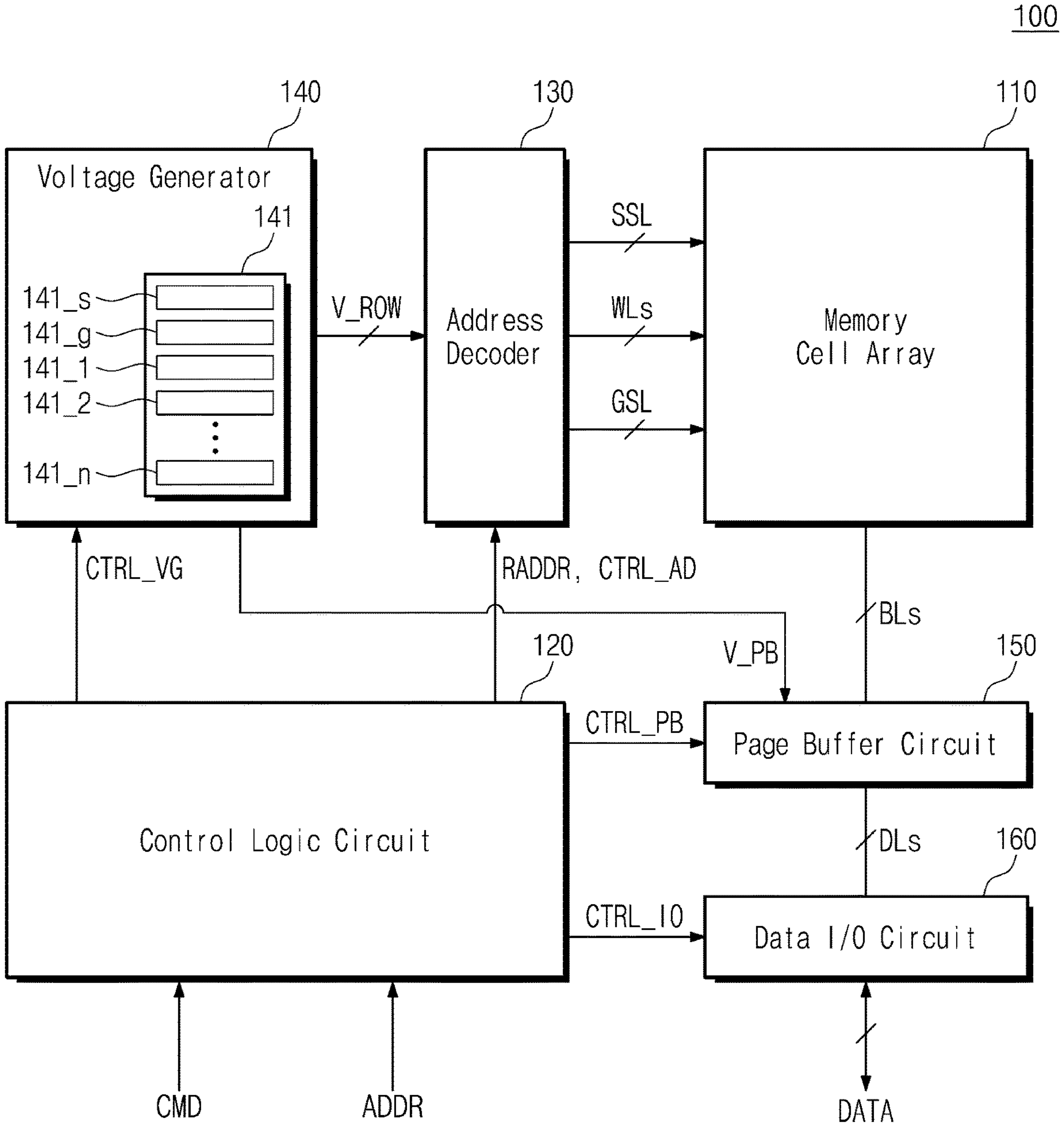
FIG. 1 is a diagram illustrating a non-volatile memory device in detail, according to an implementation of the present disclosure.

FIG. 1 is a block diagram corresponding to a non-volatile memory device 100, according to an implementation of the present disclosure. Referring to FIG. 1, the non-volatile memory device 100 may include a memory cell array 110, a control logic circuit 120, an address decoder 130, a voltage generator 140, a page buffer circuit 150, and a data input/output (I/O) circuit 160. Below, for convenience of description, an example in which a command CMD and data "DATA" are provided to various blocks is illustrated, but the present disclosure is not limited thereto. Below, an implementation in which the non-volatile memory device 100 is a flash memory device will be described as an example. However, the present disclosure is not limited thereto.

The memory cell array 110 may store data of the non-volatile memory device 100. In some implementations, the memory cell array 110 may include a plurality of blocks. A block structure of the memory cell array 110 will be described in detail with reference to FIG. 2A.

In some implementations, each memory cell of the memory cell array 110 may be programmed to store multi-bit data. For example, each memory cell of the memory cell array 110 may be programmed to store 3-bit data. How to program memory cells will be described in detail with reference to FIG. 3.

The control logic circuit 120 may control an operation of the non-volatile memory device 100. The control logic circuit 120 may receive the command CMD and an address ADDR from the outside of the non-volatile memory device 100. The control logic circuit 120 may control various components in response to the command CMD and the address ADDR such that the non-volatile memory device 100 performs various operations. In some implementations, various operations of the non-volatile memory device 100 may include a read operation, a write operation, an erase operation, or a verify operation.

In the non-volatile memory device 100, the address ADDR may include an address of the memory cell array 110, at which an operation indicated by the command CMD is to be performed. For example, when the command CMD indicates the read operation, the address ADDR may include an address of the memory cell array 110, at which data are to be read.

In some implementations, the control logic circuit 120 may output signals for controlling function blocks in the non-volatile memory device 100. For example, referring to FIG. 1, the control logic circuit 120 may provide a voltage generator control signal CTRL_VG to the voltage generator 140 and may provide a page buffer control signal CTRL_PB to the page buffer circuit 150. The control logic circuit 120 may provide a data input/output control signal CTRL_IO to the data input/output circuit 160. The control logic circuit 120 may provide an address decoder control signal CTRL_AD and a row address RADDR to the address decoder 130.

The address decoder 130 may be connected to the memory cell array 110 through a string selection line SSL, wordlines WLs, and a ground selection line GSL. The address decoder 130 may receive the row address RADDR from the address decoder 130. The row address RADDR may include an address value corresponding to a row of the memory cell array 110.

The address decoder 130 may decode the row address RADDR received from the control logic circuit 120. The address decoder 130 may transfer voltages from the voltage generator 140 to the string selection line SSL, the wordlines WLs, and the ground selection line GSL of the memory cell array 110, based on a decoding result. This is provided as an example, and the present disclosure is not limited thereto. For example, the address decoder 130 may be implemented to receive the address ADDR directly from the outside of the non-volatile memory device 100.

In some implementations, the address decoder 130 may operate under control of the control logic circuit 120. For example, the address decoder 130 may operate in response to the address decoder control signal CTRL_AD. A structure of the address decoder 130 according to an implementation of the present disclosure will be described in detail with reference to FIG. 11.

The voltage generator 140 may generate various voltages necessary for the operation of the non-volatile memory device 100. In some implementations, the voltage generator 140 may generate voltages V_ROW or V_PB in response to the voltage generator control signal CTRL_VG, so as to be provided to any other blocks. For example, the voltage generator 140 may provide the address decoder 130 with row voltages V_ROW necessary for the operation of the address decoder 130 and may provide the page buffer circuit 150 with page buffer voltages V_PB necessary for the operation of the page buffer circuit 150. The row voltages V_ROW may include voltages necessary for the string selection line SSL, the ground selection line GSL, and the wordlines WLs.

In some implementations, the voltage generator 140 may operate under control of the control logic circuit 120. For example, the voltage generator 140 may operate in response to the voltage generator control signal CTRL_VG.

The voltage generator 140 may include a row voltage generator 141. Referring to FIG. 1, the row voltage generator 141 may include a string selecting voltage generating unit 141_*s*, a ground selecting voltage generating unit 141_*g*, and wordline voltage generating units 141_1 to 141_*n*. In some implementations, "n" may be a positive integer of 2 or more and may be determined based on an operation scheme of the non-volatile memory device 100, the number of bits of data that the memory cell array 110 stores, etc.

In some implementations, the row voltage generator 141 may generate the row voltages V_ROW that the voltage generator 140 provides to the address decoder 130. For example, the row voltage generator 141 may generate voltages to be provided to the string selection line SSL, the wordlines WLs, and the ground selection line GSL of the memory cell array 110.

The string selecting voltage generating unit 141_*s* may generate a voltage to be provided to the string selection line SSL. The ground selecting voltage generating unit 141_*g* may generate a voltage to be provided to the ground selection line GSL. The wordline voltage generating units 141_1 to 141_*n* may generate voltages to be provided to the wordlines WLs. In some implementations, at least one of the wordline voltage generating units 141_1 to 141_*n* may generate a negative voltage.

The row voltage generator 141 that includes one string selecting voltage generating unit 141_*s* and one ground selecting voltage generating unit 141_g is illustrated and described as an example, but the present disclosure is not limited thereto. In some implementations, the row voltage generator 141 may include at least one or more string selection voltage generating units 141_s and at least one or more ground selecting voltage generating units 141_g depending on an operation scheme of the non-volatile memory device 100, a program scheme of a memory cell, etc. A structure of the voltage generator 140 according to an implementation of the present disclosure will be described in detail with reference to FIG. 13.

Below, for convenience of description, the description will be given as the row voltage generator 141 generates voltages necessary for the string selection line SSL, the ground selection line GSL, and the wordlines WLs of the memory cell array 110. However, the present disclosure is not limited thereto. Although not illustrated, the present disclosure may be carried out such that the voltage generator 140 generates voltages necessary for the string selection line SSL, the ground selection line GSL, and the wordlines WLs of the memory cell array 110 so as to be provided to the memory cell array 110, directly or through any other component(s).

The page buffer circuit 150 may be connected to the memory cell array 110 through bitlines BLs. The page buffer circuit 150 may temporarily store data read from the memory cell array 110 or may temporarily store data to be stored in the memory cell array 110. In some implementations, the page buffer circuit 150 may operate under control of the control logic circuit 120. For example, the page buffer circuit 150 may perform the above operations in response to the page buffer control signal CTRL_PB from the control logic circuit 120. One page buffer PB in the page buffer circuit 150 will be described in detail with reference to FIG. 2B.

The data input/output circuit 160 may transfer data received from the outside of the non-volatile memory device 100 to the page buffer circuit 150 through data lines DLs or may transfer data received from the page buffer circuit 150 through the data lines DLs to the outside of the non-volatile memory device 100. In some implementations, the data input/output circuit 160 may operate under control of the control logic circuit 120. For example, the data input/output circuit 160 may perform the above operations in response to the data input/output control signal CTRL_IO from the control logic circuit 120.

Figure 2A:
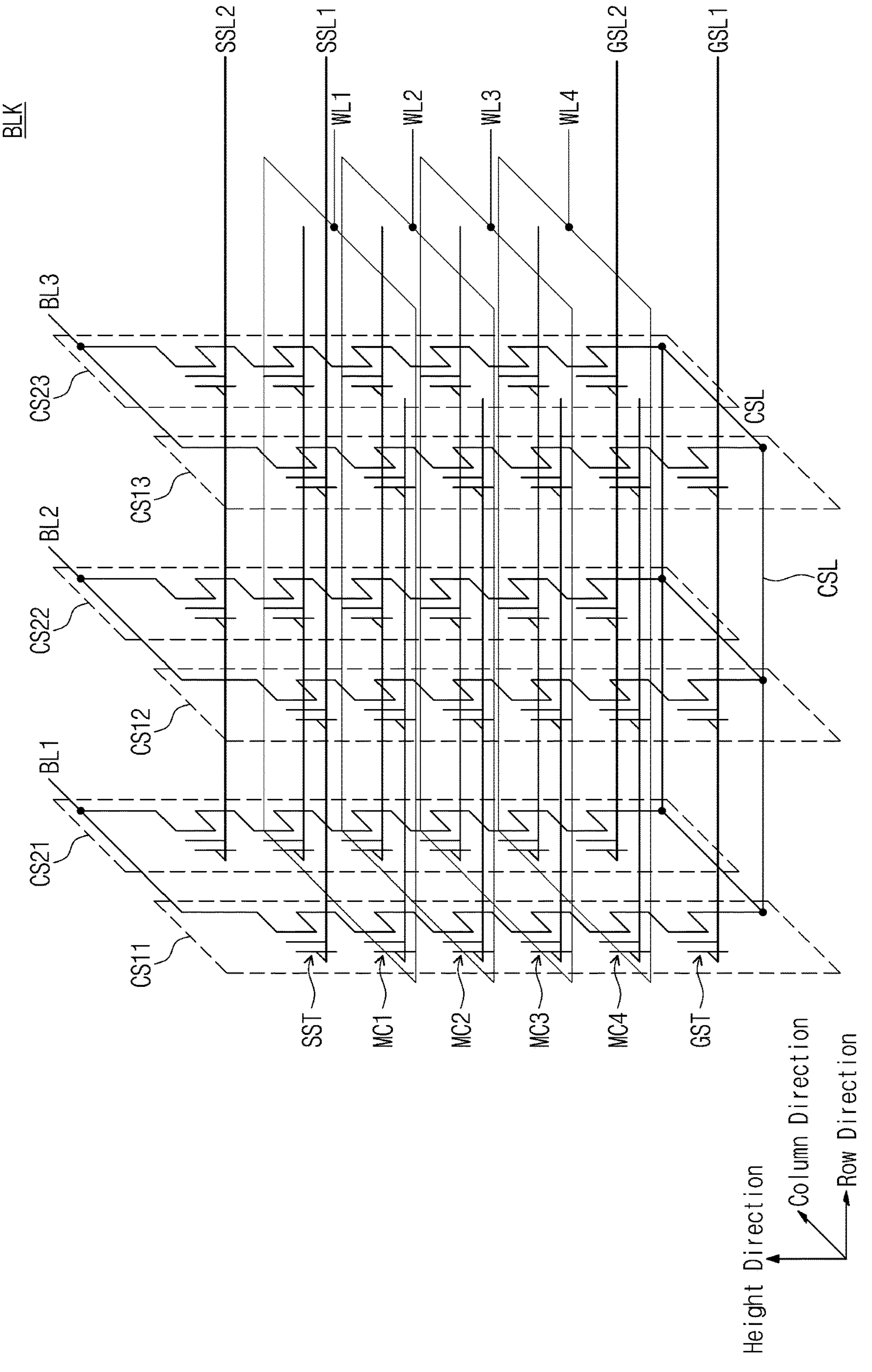
FIG. 2A is a diagram illustrating an example of one memory block of a memory cell array of FIG. 1, according to an implementation of the present disclosure.
Figure 2B:
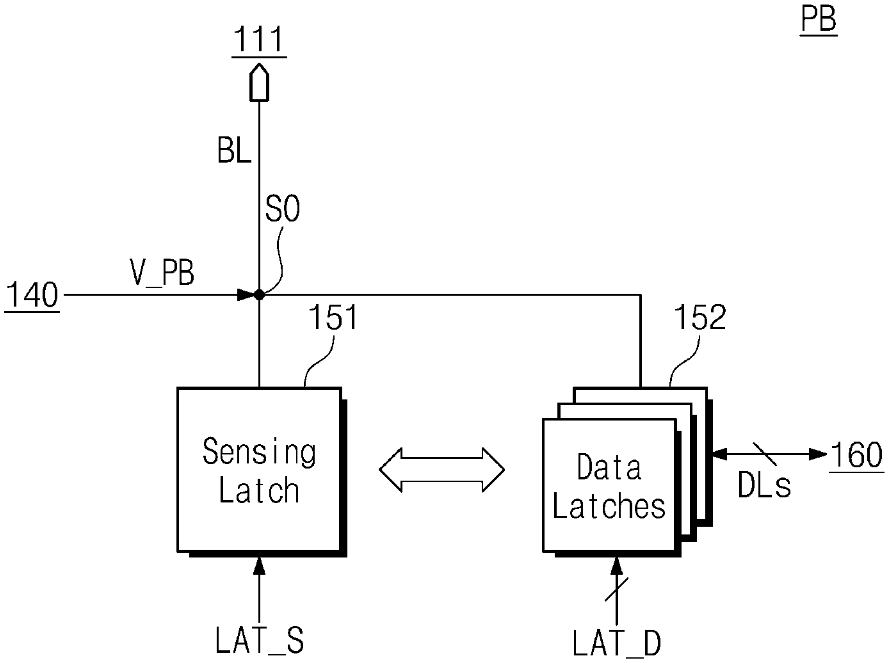
FIG. 2B is a diagram illustrating one page buffer in a page buffer circuit of FIG. 1, according to an implementation of the present disclosure.

FIG. 2A is a diagram illustrating one memory block BLK among a plurality of blocks included in the memory cell array 110 of FIG. 1. FIG. 2B is a block diagram illustrating one page buffer PB in the page buffer circuit 150 of FIG. 1 in detail, according to an implementation of the present disclosure. FIG. 2 may be composed of FIG. 2A and FIG. 2B.

FIG. 2A shows the memory block BLK. However, this is provided as an example for description, and the present disclosure is not limited thereto. Referring to FIG. 2A, the memory block BLK may include a plurality of cell strings CS11, CS21, CS12, CS22, CS13, and CS23. The plurality of cell strings CS11, CS21, CS12, CS22, CS13, and CS23 may be arranged in a row direction and a column direction.

Cell strings located at the same column from among the plurality of cell strings CS11, CS21, CS12, CS22, CS13, and CS23 may be connected to the same bitline. Cell strings located at the same row from among the plurality of cell strings CS11, CS21, CS12, CS22, CS13, and CS23 may be connected to different bitlines. For example, the cell strings CS11 and CS21 may be connected to a first bitline BL1, the cell strings CS12 and CS22 may be connected to a second bitline BL2, and the cell strings CS13 and CS23 may be connected to a third bitline BL3.

Each of the plurality of cell strings CS11, CS21, CS12, CS22, CS13, and CS23 may include a plurality of cell transistors. Each of the plurality of cell transistors may be implemented with a charge trap flash (CTF) memory cell. The plurality of cell transistors may be stacked in a height direction being a direction perpendicular to a plane (e.g., a semiconductor substrate) that is perpendicular to a plane defined by the row direction and the column direction.

The plurality of cell transistors may be connected between the corresponding bitline (e.g., one of the first bitline BL1 to the third bitline BL3) and a common source line CSL. For example, the plurality of cell transistors may include a string selection transistor SST, memory cells MC1 to MC4, and a ground selection transistor GST. The string selection transistor SST may be provided between the serially-connected memory cells MC1 to MC4 and the corresponding bitline (e.g., one of the first bitline BL1 to the third bitline BL3). The ground selection transistor GST may be provided between the serially-connected memory cells MC1 to MC4 and the common source line CSL.

In the plurality of cell strings CS11, CS21, CS12, CS22, CS13, and CS23, memory cells located at the same height may share the same wordline. For example, the first memory cells MC1 of the plurality of cell strings CS11, CS21, CS12, CS22, CS13, and CS23 may be located at the same height from a substrate and may share a first wordline WL1. The second memory cells MC2 of the plurality of cell strings CS11, CS21, CS12, CS22, CS13, and CS23 may be located at the same height from the substrate and may share a second wordline WL2. Likewise, the third and fourth memory cells MC3 and MC4 of the plurality of cell strings CS11, CS21, CS12, CS22, CS13, and CS23 may share corresponding wordlines.

In some implementations, one page may be composed of memory cells belonging to cell strings of the same row from among memory cells located at the same height. For example, the first page may be composed of memory cells included in the cell strings CS11, CS12 and CS13 from among the first memory cells MC1. In this case, the memory cells of the first page may share the same wordline and may respectively correspond to different bitlines. According to the above description, the memory cells of the first page may be simultaneously programmed and may be simultaneously read.

String selection transistors located at the same height and the same row from among the string selection transistors SST of the plurality of cell strings CS11, CS21, CS12, CS22, CS13, and CS23 may be connected to the same string selection line SSL1 or SSL2. For example, the cell strings CS11, CS12, and CS13 may be connected to the first string selection line SSL1. The cell strings CS21, CS22, and CS23 may be connected to the second string selection line SSL2.

Ground selection transistors located at the same height and the same row from among the ground selection transistors GST of the plurality of cell strings CS11, CS21, CS12, CS22, CS13, and CS23 may be connected to the same ground selection line GSL1 or GSL2.

The memory block BLK of FIG. 2A is provided as an example. For example, the number of cell strings may increase or decrease, and the number of rows of cell strings and the number of columns of cell strings may increase or decrease depending on the change in the number of cell strings. Also, the number of cell transistors (e.g., GST, MC, and SST) of the memory block BLK may increase or decrease, and the height of the memory block BLK may increase or decrease depending on the number of cell transistors. Also, the number of lines (e.g., GSL, WL, and CSL) connected to cell transistors may increase or decrease depending on the number of cell transistors, and transistors for controlling an operation may be further included depending on a characteristic of the memory block BLK.

FIG. 2B shows the page buffer PB that is included in the page buffer circuit 150 of FIG. 1 and is connected to one bitline BL. Referring to FIG. 2B, the page buffer PB may include a sensing latch 151 and data latches 152.

In a sensing node (SO) develop process, the sensing latch 151 may determine data of a cell string connected through the bitline BL in response to a sensing latch signal LAT_S. The SO develop process refers to a process in which levels of sensing nodes SO change based on the voltage applied to transistors in the plurality of cell strings CS11, CS21, CS12, CS22, CS13, and CS23 of FIG. 2A. In some implementations, the sensing latch signal LAT_S may be generated based on the page buffer control signal CTRL_PB received from the control logic circuit 120.

In some implementations, the sensing latch 151 may determine data of the connected cell string based on a current level of the sensing node SO. For example, the sensing latch 151 may determine the data of the connected cell string or may verify a program state of a selected memory cell, by comparing a level of a current flowing from the sensing node SO to the bitline BL through the cell string with a reference current level.

In some implementations, the sensing latch 151 may determine the data of the connected cell string based on the level change in the potential (or the voltage) of the sensing node SO. For example, the sensing latch 151 may determine the data of the connected cell string or may verify the program state of the selected memory cell, by comparing the potential level of the sensing node SO with a reference potential level.

The sensing latch 151 may exchange data with the data latches 152. For example, the sensing latch 151 may exchange data with the data latches 152 in response to the sensing latch signal LAT_S. In some implementations, the sensing latch 151 may output information sensed from the sensing node SO to the data latches 152 or may receive data corresponding to a program state of a memory cell to be verified from the data latches 152.

The data latches 152 may temporarily store data received from the sensing latch 151. In some implementations, in the data latches 152, the number of individual data latches may be determined based on a kind of the memory cells MC1 to MC4 of the memory cell array 110. For example, when the memory cells MC1 to MC4 are triple level cells, the data latches 152 may include three individual data latches.

In some implementations, the data latches 152 may output the data, which are stored in response to a data latch signal LAT_D, to the data input/output circuit 160 through the data lines DLs. The data latch signal LAT_D may be generated based on the page buffer control signal CTRL_PB. In some implementations, in response to the data latch signal LAT_D, the data latches 152 may receive data to be stored or may receive data being used for verifying a program state of the corresponding memory cell from the data input/output circuit 160.

Figure 3:
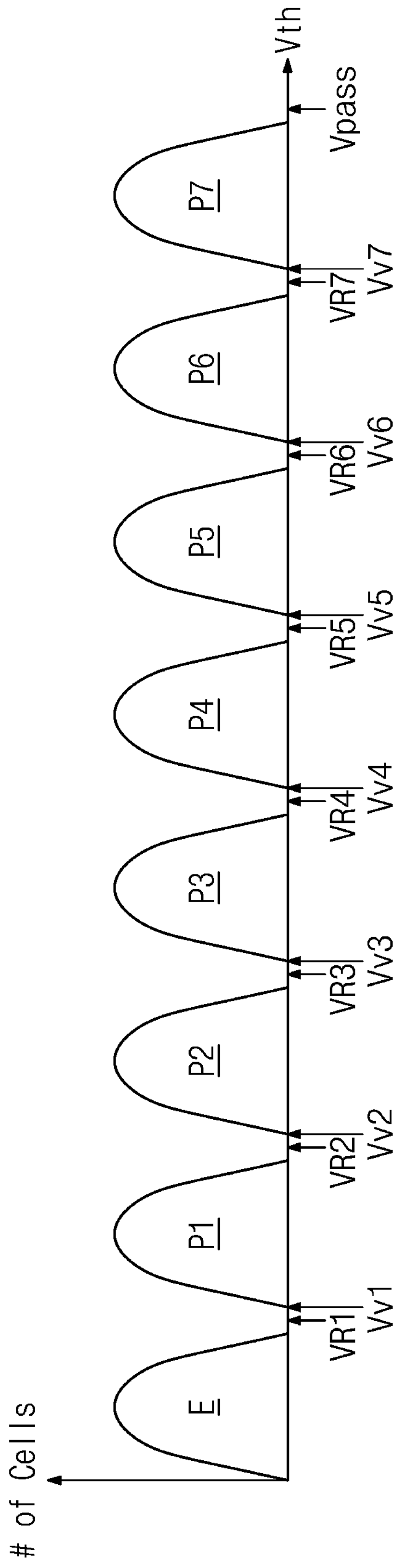
FIG. 3 is a diagram illustrating an example of a program state of a memory cell array of FIG. 1, according to an implementation of the present disclosure.

FIG. 3 is a diagram illustrating threshold voltage distributions of the plurality of memory cells MC1 to MC4 included in the memory block BLK of FIG. 2A. In FIG. 3, a horizontal axis represents a threshold voltage Vth, and a vertical axis represents the number of memory cells. FIG. 3 shows threshold voltage distributions of triple level cells (TLCs) each configured to store 3 bits. However, the present disclosure is not limited thereto. For example, each of the plurality of memory cells may be variously implemented with a single level cell (SLC), a multi-level cell (MLC), a quad-level cell (QLC), a penta level cell (PLC), etc.

Referring to FIGS. 1, 2A, and 3, the non-volatile memory device 100 may store data in the memory cells by controlling threshold voltages of the memory cells. For example, each of the memory cells may be programmed to have one of an erase state "E" and first to seventh program states P1 to P7.

The non-volatile memory device 100 may read the data stored in the memory cells by sensing program states of the memory cells. For example, the non-volatile memory device 100 may read the data stored in the memory cells by sensing threshold voltages of the memory cells by using first to seventh read voltages VR1 to VR7.

The non-volatile memory device 100 may verify the program states of the memory cells. For example, the non-volatile memory device 100 may verify the program states of the memory cells by sensing the threshold voltages of the memory cells by using first to seventh verify voltages Vv1 to Vv7.

An example in which all the first to seventh read voltages VR1 to VR7 are positive voltages is illustrated in FIG. 3, but the present disclosure is not limited thereto. For example, the lowest voltage of the erase state "E" and the lowest voltage of the first program state P1 may be negative voltages. Below, for convenience of description, an implementation of the present disclosure will be described based on a triple level cell. However, the present disclosure is not limited thereto. For example, it may be understood that the present disclosure is applicable to various memory cells, which store two bits or four or more bits, such as an MLC, a QLC, and a PLC.

Figure 4:
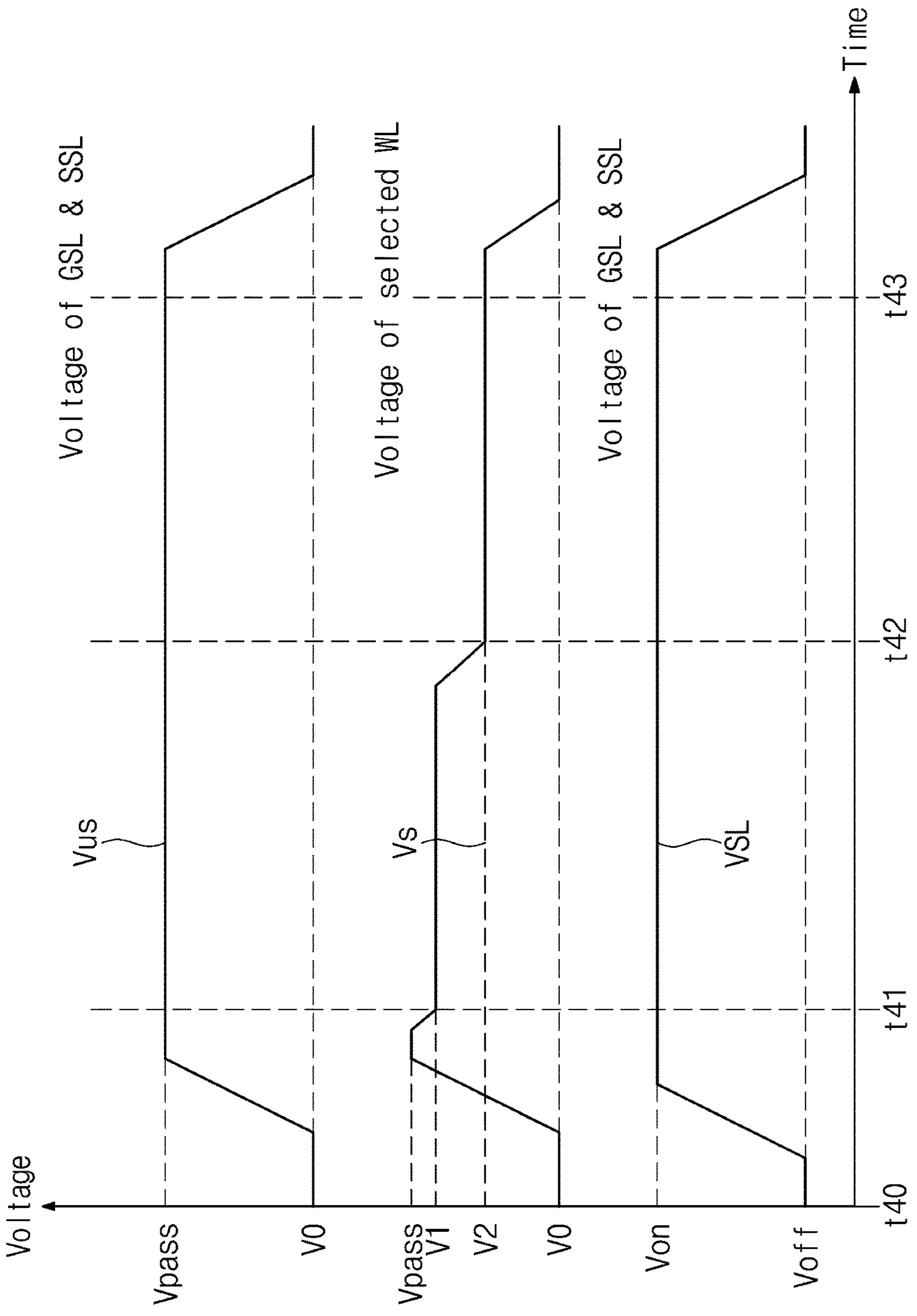
FIG. 4 is a timing diagram illustrating voltage changes of a string selection line, wordlines, and a ground selection line over time in a read operation of a non-volatile memory device, according to an implementation of the present disclosure.

FIG. 4 is a timing diagram illustrating voltage changes of the string selection line SSL, the wordlines WLs, and the ground selection line GSL of the memory block BLK of FIG. 2A over time in a read operation of the non-volatile memory device 100 of FIG. 1, according to an implementation of the present disclosure. Referring to FIG. 4, a voltage VSL (hereinafter referred to as a "selection line voltage") of a ground selection line and a string selection line shows a change in a voltage of a ground selection line and a string selection line located at the same cell string. For example, the selection line voltage VSL may be a voltage of the first string selection line SSL1 and the first ground selection line GSL1 of FIG. 2A.

A selected wordline voltage Vs may be a voltage applied to a wordline of a page targeted for the read operation, in the memory cell array 110. An unselected wordline voltage Vus may be a voltage of the remaining wordlines other than the selected wordline. Below, changes in the selection line voltage VSL, the selected wordline voltage Vs, and the unselected wordline voltage Vus in the read operation of the non-volatile memory device 100 will be described with reference to FIGS. 2A, 3, and 4.

A first time period from t40 (i.e., a start point of time) to t41 may be a time period in which the read operation of the non-volatile memory device 100 is prepared. In the first time period from t40 to t41, as the selection line voltage VSL changes from a turn-off voltage Voff to a turn-on voltage Von, the non-volatile memory device 100 may select a cell string targeted for the read operation.

In the first time period from t40 to t41, the unselected wordline voltage Vus may change from an initial voltage V0 to a pass voltage Vpass of FIG. 3. The voltage Vs of the selected wordline may increase from the initial voltage V0 to the pass voltage Vpass and may then change to a first voltage V1 for the read operation. As the selected wordline voltage Vs reaches the pass voltage Vpass, channels of memory cells may be formed (or prepared) for the read operation. The first voltage V1 may be one of the first to seventh read voltages VR1 to VR7 of FIG. 3.

A second time period from t41 to t42 may be a time period in which the read operation is performed using the first voltage V1. In the second time period from t41 to t42, the unselected wordline voltage Vus may maintain the pass voltage Vpass, and the selection line voltage VSL may maintain the turn-on voltage Von. The selected wordline voltage Vs may maintain the first voltage V1 and may change to a second voltage V2 before the second point in time t42 is reached. The second voltage V2 may be one of the first to seventh read voltages VR1 to VR7 of FIG. 3 and may be different from the first voltage V1. The non-volatile memory device 100 may perform the read operation by using the first voltage V1 in the second time period from t41 to t42.

A third time period from t42 to t43 may be a time period in which the read operation is performed using the second voltage V2. In the third time period from t42 to t43, the unselected wordline voltage Vus may maintain the pass voltage Vpass, and the selection line voltage VSL may maintain the turn-on voltage Von. The selected wordline voltage Vs may maintain the second voltage V2.

A fourth time period following the third point in time t43 may be a time period in which the above voltages Vus, Vs, and VSL are recovered to an initial state after the read operation is completed. For example, the unselected wordline voltage Vus may be recovered from the pass voltage Vpass to the initial voltage V0, the selected wordline voltage Vs may be recovered from the second voltage V2 to the initial voltage V0, and the selection line voltage VSL may be recovered from the turn-on voltage Von to the turn-off voltage Voff.

The above description is given as an example, and the present disclosure is not limited thereto. The number of read voltages may vary depending on an operation scheme of the non-volatile memory device 100. A large-small relationship between the first voltage V1 and the second voltage V2 being read voltages is not limited to the above example. Below, implementations of the present disclosure will be described in detail with reference to a voltage change of a selected wordline.

Figure 5:
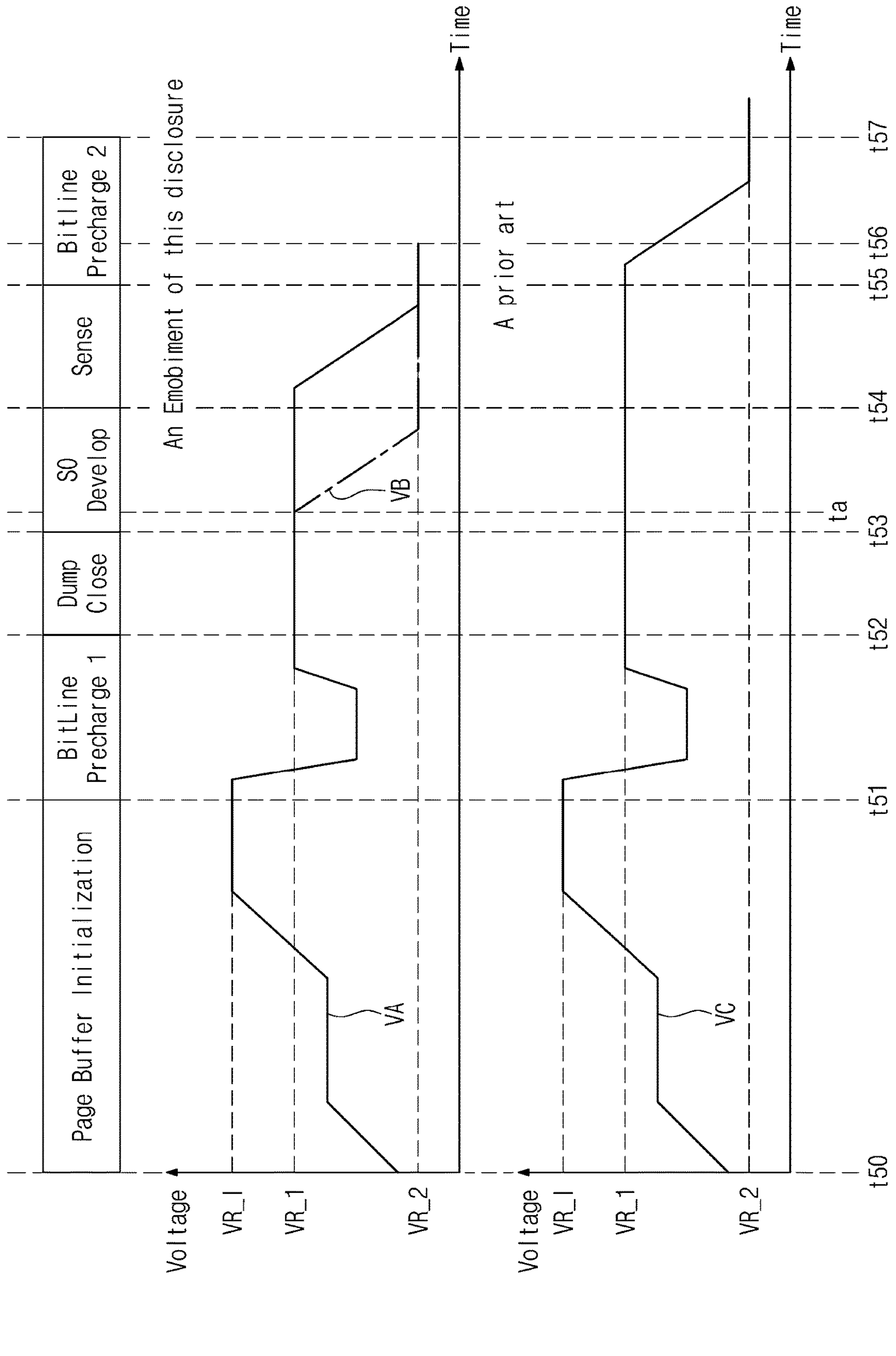
FIG. 5 is a timing diagram illustrating a voltage change of a selected wordline and a voltage change of one, which provides a voltage to the selected wordline, from among wordline voltage generating units over time in a read operation of a non-volatile memory device using two read voltages, according to an implementation of the present disclosure.

FIG. 5 is a timing diagram illustrating a voltage change of a selected wordline among the wordlines WL1 to WL4 of FIG. 2A and a voltage change of one, which provides a voltage to the selected wordline, from among the wordline voltage generating units 141_1 to 141_*n* of the row voltage generator 141 of FIG. 1 over time in the read operation of the non-volatile memory device 100 of FIG. 1 using two read voltages, according to an implementation of the present disclosure. The comparison of the read operation according to an implementation of the present disclosure with the prior art will be made with reference to FIG. 5.

For convenience of description, it is assumed that a selected wordline is the third wordline WL3 of FIG. 2A and the first wordline voltage generating unit 141_1 provides a voltage to the selected wordline. A voltage of the selected wordline is referred to as a "first voltage VA" and is shown as a solid line. A voltage of one, which provides the voltage to the selected wordline, from among the wordline voltage generating units 141_1 to 141_*n* of FIG. 1 is referred to as a "second voltage VB". A portion of the second voltage VB, which is the same as the first voltage VA, is shown as a solid line, and a portion of the second voltage VB, which is different from the first voltage VA, is shown as a dash-single dotted line.

Referring to FIG. 5, a top timing diagram shows a voltage change of a selected wordline according to an implementation of the present disclosure, and a bottom timing diagram shows a voltage change of a selected wordline according to the prior art. A third voltage VC indicates a voltage change of the selected wordline and a voltage change of one, which provides the voltage of the selected wordline, from among the wordline voltage generating units 141_1 to 141_*n* of FIG. 1 in the read operation of the non-volatile memory device 100 according to the prior art.

Referring to FIGS. 1, 2, 3, and 5, a time period from t50 (i.e., a start point in time) to t51 may be a page buffer initialization period. In the page buffer initialization period from t50 to 551, the non-volatile memory device 100 may perform page buffer initialization. The non-volatile memory device 100 may prepare an operation of reading or writing data or an operation of verifying program states of memory cells, by initializing the page buffer circuit 150. In some implementations, the page buffer circuit 150 may be initialized under control of the control logic circuit 120. For example, the page buffer circuit 150 may be initialized by the page buffer control signal CTRL_PB.

In the page buffer initialization period from t50 to t51, the first voltage VA, the second voltage VB, and the third voltage VC may identically change. In some implementations, the first voltage VA, the second voltage VB, and the third voltage VC may change such that channels of memory cell transistors in the plurality of cell strings CS11, CS12, CS21, CS22, CS13, and CS23 of FIG. 2A are initialized. For example, the first voltage VA and the second voltage VB may increase to an initialization voltage VR_I, and the initialization voltage VR_I may be the pass voltage Vpass of FIG. 3.

A time period from t51 to t52 may be a first bitline precharge period. In the first bitline precharge period from t51 to t52, the bitlines BLs may be charged with charges for the read operation. In some implementations, the bitlines BLs may be charged with charges through the operation of the page buffer circuit 150. For example, the bitlines BLs may be charged with charges by the page buffer circuit 150 based on the page buffer voltages V_PB.

In the first bitline precharge period from t51 to t52, the first voltage VA, the second voltage VB, and the third voltage VC may change to the first read voltage VR_1. The first read voltage VR_1 may be one of the first to seventh read voltages VR1 to VR7 of FIG. 3.

The voltage changes of the selected wordline WL, the string selection line SSL, and the ground selection line GSL of the memory cell array 110 in the time period from t50 to t52 may be the same as those in the time period from t40 to t41 of FIG. 4. For example, the first string selection line SSL1 and the first ground selection line GSL1 of FIG. 2A may be set to the turn-on voltage Von, and the unselected wordlines WL1, WL2, and WL4 may be set to the pass voltage Vpass.

The change in the first voltage VA, the second voltage VB, and the third voltage VC in the time period from t50 to t52 is provided as an example, and the present disclosure is not limited thereto. A change of any other voltage may be included in the scope and spirit of the invention if the first voltage VA reaches to the initialization voltage VR_I in the page buffer initialization period from t50 to t51 and reaches the first read voltage VR_1 in the first bitline precharge period from t51 to t52. This is also applied to the second voltage VB and the third voltage VC.

A time period from t52 to t53 may be a dump close period. All of the first voltage VA, the second voltage VB, and the third voltage VC may be maintained at the first read voltage VR_1. In some implementations, for a sensing operation, the page buffer circuit 150 may dump the data of the sensing latch 151 to the data latches 152 in response to the page buffer control signal CTRL_PB.

A time period from t53 to t54 may be an SO develop period. In the SO develop period from t53 to t54, the non-volatile memory device 100 may perform an SO develop operation. In the time period from t53 to t54, the third voltage VC may be maintained at the first read voltage VR_1.

In the time period from t53 to t54, the first voltage VA and the second voltage VB may be different from each other. In some implementations, the selected wordline may be disconnected from one, which provides the voltage to the selected wordline, from among the wordline voltage generating units 141_1 to 141_*n*. For example, the third wordline WL3 may be disconnected from the first wordline voltage generating unit 141_1 in a time period from t53 to ta. In this case, the selected wordline may be floated and may maintain an existing voltage. For example, the first voltage VA may be maintained at the first read voltage VR_1 up to a fourth point in time t54.

In some implementations, the selected wordline may be disconnected from the voltage generator 140, based on an operation of a switch located between the voltage generator 140 and the memory cell array 110. For example, as a switch located between the third wordline WL3 and the first wordline voltage generating unit 141_1 is turned off, the third wordline WL3 may be disconnected from the first wordline voltage generating unit 141_1. This will be described in detail with reference to FIGS. 11 and 13.

In some implementations, after one, which provides the voltage to the selected wordline, from among the wordline voltage generating units 141_1 to 141_*n* is disconnected from the selected wordline, the one wordline voltage generating unit may start to generate a next read voltage. For example, the first wordline voltage generating unit 141_1 may start to generate the second read voltage VR_2 at the a-th point in time ta, and the second voltage VB may start to change to the second read voltage VR_2. The second read voltage VR_2 may be one of the first to seventh read voltages VR1 to VR7 of FIG. 3 and may be different from the first read voltage VR_1. That is, at the fourth point in time t54, the first voltage VA and the second voltage VB may be different from each other.

A time period from t54 to t55 may be a sensing period. The non-volatile memory device 100 may sense a level of the sensing node SO in the sensing period from t54 to t55. The non-volatile memory device 100 may determine data of a cell transistor (i.e., memory cell) of a corresponding cell string, which is connected to the selected wordline, by comparing the level of the sensing node SO with a reference level.

For example, when the page buffer PB is connected to the first bitline BL1 and voltages of the first string selection line SSL1 and the first ground selection line GSL1 are the turn-on voltage Von, the level of the sensing node SO in the page buffer PB may change depending on the data of the third memory cell MC3 of the cell string CS11. Information corresponding to a result of comparing the level of the sensing node SO in the page buffer PB with the reference level may be stored in the sensing latch 151 depending on the sensing latch signal LAT_S.

In the sensing period from t54 to t55, the selected wordline may be again connected to one, which provides the voltage to the selected wordline, from among the wordline voltage generating units 141_1 to 141_*n*. For example, in the sensing period from t54 to t55, the third wordline WL3 and the first wordline voltage generating unit 141_1 may be again connected. Afterwards, the first voltage VA may start to change to the second read voltage VR_2.

In some implementations, the selected wordline may be again connected to the voltage generator 140, based on the operation of the switch located between the voltage generator 140 and the memory cell array 110. For example, as the switch located between the third wordline WL3 and the first wordline voltage generating unit 141_1 is turned on, the third wordline WL3 may be again connected to the first wordline voltage generating unit 141_1.

A time period from t55 to t57 may be a second bitline precharge period. The non-volatile memory device 100 may prepare the read operation that is performed using the second read voltage VR_2. Excepting the selected wordline and one, which provides the voltage to the selected wordline, from among the wordline voltage generating units 141_1 to 141_*n*, an operation of the non-volatile memory device 100 may be the same as the operation in the first bitline precharge period.

In a conventional read operation, the third voltage VC may change for a next read operation in the second bitline precharge period. For example, the third voltage VC may change to the second read voltage VR_2 in the second bitline precharge period from t55 to t57. In the conventional read operation, the non-volatile memory device 100 may perform the read operation by using the second read voltage VR_2 after the seventh point in time t57. This may be similar to the operation in the time period from t52 to t55.

According to an implementation of the present disclosure, the second bitline precharge period may end at the sixth point in time t56 preceding the seventh point in time t57. The non-volatile memory device 100 according to an implementation of the present disclosure may perform the read operation by using the second read voltage VR_2 after the sixth point in time t56. This may be similar to the operation in the time period from t52 to t55.

The third voltage VC starts to change from the first read voltage VR_1 to the second read voltage VR_2 in the second bitline precharge period from t55 to t57; in contrast, the first voltage VA starts to change from the first read voltage VR_1 to the second read voltage VR_2 in the sensing period from t54 to t55. As such, the non-volatile memory device 100 may decrease a time taken to perform the second bitline precharge operation. This may mean that a total time taken for the non-volatile memory device 100 to perform the read operation decreases.

The points in time t50 to t57 indicate the order of time, and an interval between points in time does not indicate a length of a time during which an operation is performed. An example in which the first read voltage VR_1 is greater than the second read voltage VR_2 is illustrated in FIG. 5, but the present disclosure is not limited thereto. For example, the case where the second read voltage VR_2 is greater than the first read voltage VR_1 may also be included in the scope and spirit of the invention.

The scheme described with reference to FIG. 5 may be more effective as a magnitude difference of two read voltages becomes greater. For example, as a magnitude difference of the first read voltage VR_1 and the second read voltage VR_2 becomes greater, the interval between the sixth point in time t56 and the seventh point in time t57 may become greater. The reason is that as a magnitude difference of read voltages increases, a time taken to change a voltage of a selected wordline increases and a length of a time period where a bitline precharge operation is performed increases.

FIG. 5 shows the read operation that the non-volatile memory device 100 performs using two read voltages. However, the present disclosure is not limited thereto. As in the above description, the non-volatile memory device 100 may perform the read operation by using three or more read voltages. In some implementations, the non-volatile memory device 100 may perform the read operation by using a combination of the conventional scheme and the scheme according to an implementation of the present disclosure. Below, the read operation that the non-volatile memory device 100 performs by using three read voltages will be described in detail with reference to FIGS. 6A to 6C.

Figure 6A:
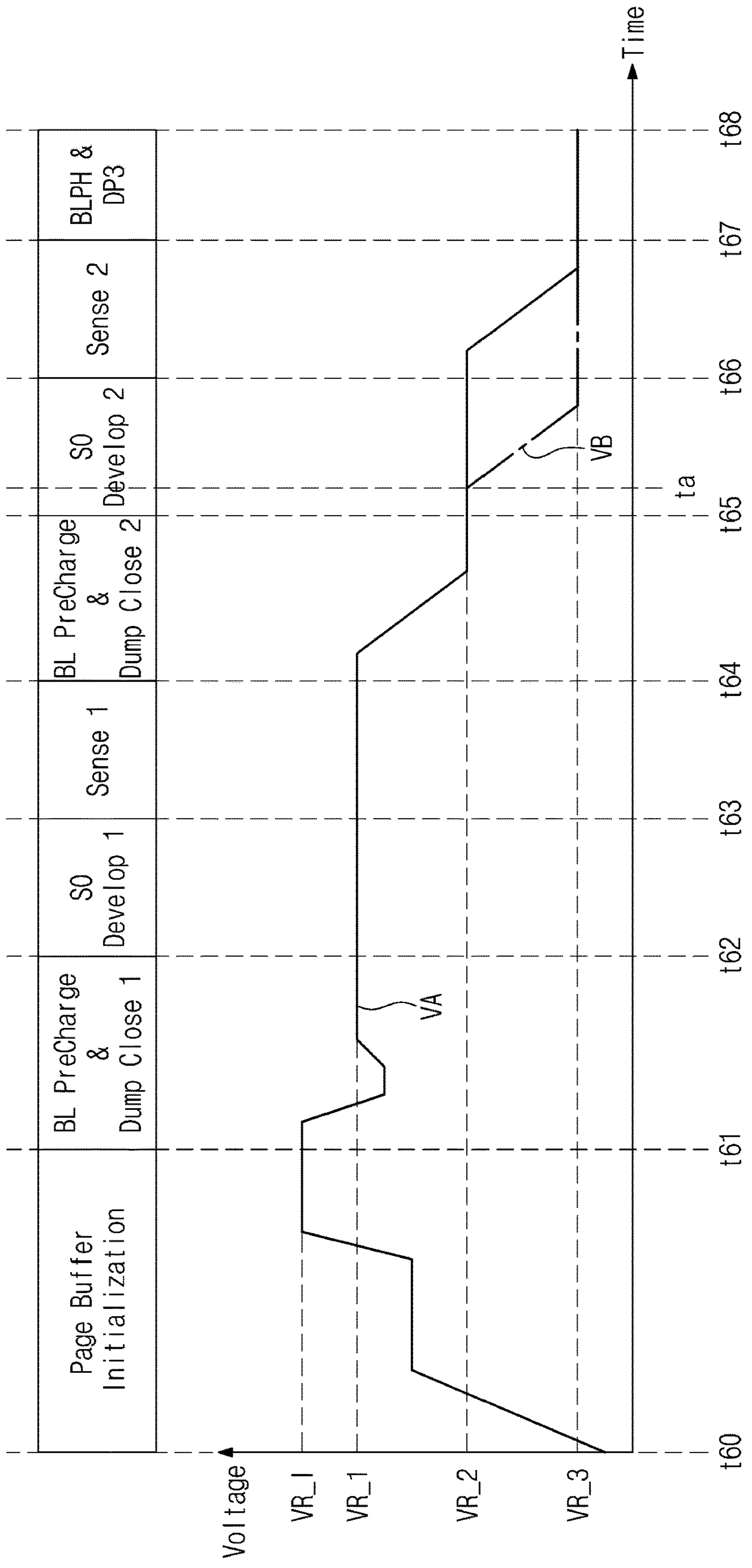
FIGS. 6A, 6B, and 6C are timing diagrams illustrating a voltage change of a selected wordline and a voltage change of one, which provides a voltage to the selected wordline, from among wordline voltage generating units over time in a read operation of a non-volatile memory device using three read voltages, according to an implementation of the present disclosure.
Figure 6B:
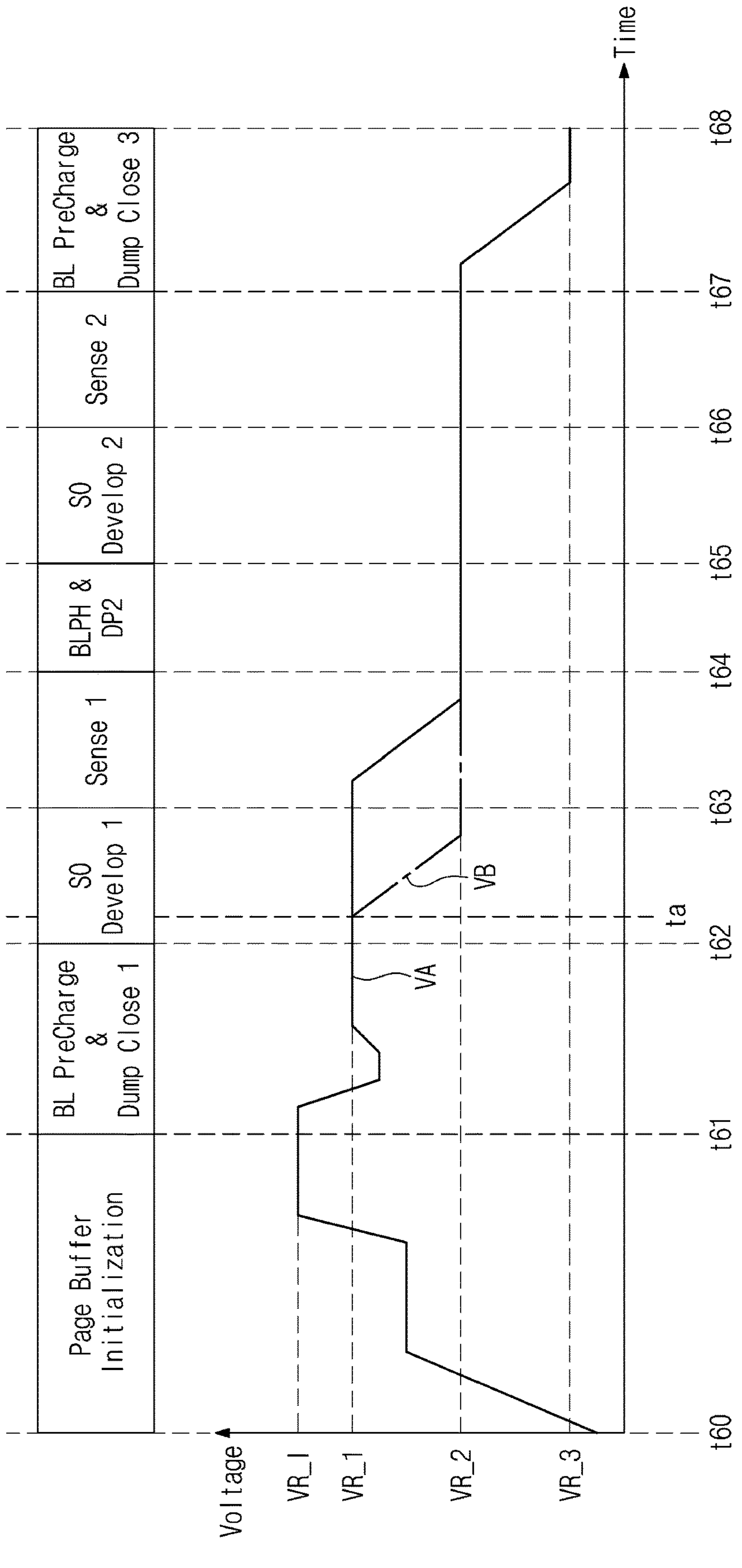
Figure 6C:
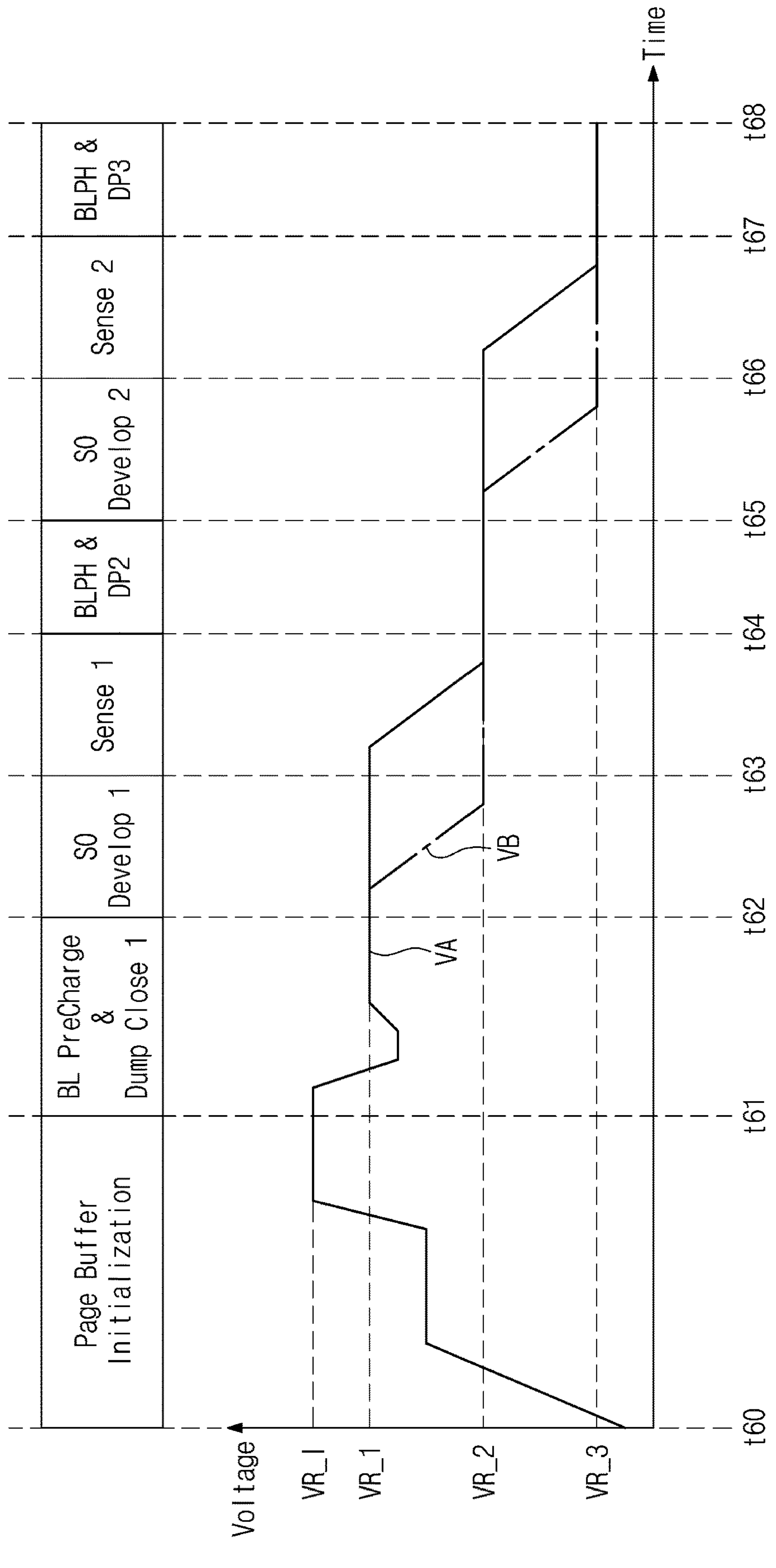

FIGS. 6A, 6B, and 6C are timing diagrams illustrating a voltage change of a selected wordline among the wordlines WL1 to WL4 of FIG. 2A and a voltage change of one, which provides a voltage to the selected wordline, from among the wordline voltage generating units 141_1 to **141_*n* of FIG. 1 over time in the read operation of the non-volatile memory device 100 of FIG. 1 using three read voltages, according to an implementation of the present disclosure. FIG. 6 may include FIG. 6A, FIG. 6B, or FIG. 6C. The operation of the non-volatile memory device 100 according to an implementation of the present disclosure will be described with reference to FIGS. 1 to 3 and 6**.

For convenience of description, it is assumed that a selected wordline is the third wordline WL3 of FIG. 2A and the first wordline voltage generating unit 141_1 provides a voltage to the selected wordline. A voltage of the selected wordline is referred to as a "first voltage VA" and is shown as a solid line. A voltage of one, which provides the voltage to the selected wordline, from among the wordline voltage generating units 141_1 to **141_*n* of FIG. 1** is referred to as a "second voltage VB". A portion of the second voltage VB, which is the same as the first voltage VA, is shown as a solid line, and a portion of the second voltage VB, which is different from the first voltage VA, is shown as a dash-single dotted line.

In some implementations, referring to FIG. 6, the first read voltage VR_1, the second read voltage VR_2, and the third read voltage VR_3 may be read voltages that are applied to the memory cell array 110. For example, the first read voltage VR_1, the second read voltage VR_2, and the third read voltage VR_3 may be a set of different read voltages among the read voltages VR1 to VR7. A large-small relationship between the first read voltage VR_1, the second read voltage VR_2, and the third read voltage VR_3 is provided as an example, and the present disclosure is not limited thereto. Points in time t60 to t68 indicate the order of operation, and an interval between points in time does not indicate a length of a time during which an operation is performed.

FIG. 6A is a timing diagram illustrating the readout operation that the non-volatile memory device 100 according to an implementation of the present disclosure performs by using three read voltages. Referring to FIG. 6A, a page buffer initialization period may range from t60 to t61. An operation of the non-volatile memory device 100 in the page buffer initialization period may be the same as the operation of the non-volatile memory device 100 in the time period from t50 to t51 described with reference to FIG. 5.

A time period from t61 to t62 may be a first bitline precharge and dump close period. An operation of the non-volatile memory device 100 in the first bitline precharge and dump close period from t61 to t62 may be the same as the operation of the non-volatile memory device 100 in the time period from t51 to t53 described with reference to FIG. 5.

A time period from t62 to t63 may be a first SO develop period. In the first SO develop period from t62 to t63, the non-volatile memory device 100 may perform the SO develop operation. The first voltage VA and the second voltage VB may be maintained at the first read voltage VR_1. Excepting the selected wordline and one, which provides the voltage to the selected wordline, from among the wordline voltage generating units 141_1 to **141_*n*, an operation of the non-volatile memory device 100 may be the same as the operation of the non-volatile memory device 100 in the SO develop period from t53 to t54 described with reference to FIG. 5**.

A time period from t63 to t64 may be a first sensing period. The first voltage VA and the second voltage VB may be identically maintained at the first read voltage VR_1. Excepting the selected wordline and one, which provides the voltage to the selected wordline, from among the wordline voltage generating units 141_1 to **141_*n*, an operation of the non-volatile memory device 100 may be the same as the operation in the sensing period from t54 to t55 described with reference to FIG. 5**.

A time period from t64 to t65 may be a second bitline precharge and dump close period. The first voltage VA and the second voltage VB may identically change to a next read voltage. For example, the first voltage VA and the second voltage VB may change the second read voltage VR_2.

Excepting the selected wordline and one, which provides the voltage to the selected wordline, from among the wordline voltage generating units 141_1 to **141_*n*, an operation of the non-volatile memory device 100 may be similar to the conventional operation of the non-volatile memory device 100 in the second bitline precharge period from t55 to t57 described with reference to FIG. 5**.

A time period from t65 to t66 may be a second SO develop period. Excepting the selected wordline and one, which provides the voltage to the selected wordline, from among the wordline voltage generating units 141_1 to **141_*n*, an operation of the non-volatile memory device 100 may be the same as the operation in the SO develop period from t54 to t55 described with reference to FIG. 5**.

In the second SO develop period from t65 to t66, the first voltage VA and the second voltage VB may be different from each other. In some implementations, the selected wordline may be disconnected from one, which provides the voltage to the selected wordline, from among the wordline voltage generating units 141_1 to **141_*n*. For example, the third wordline WL3 may be disconnected from the first wordline voltage generating unit 141_1 in a time period from t65 to ta. In this case, the selected wordline may be floated and may maintain an existing voltage. For example, the first voltage VA may be maintained at the second read voltage VR_2 up to a sixth point in time t66**.

In some implementations, the selected wordline may be disconnected from the voltage generator 140, based on the operation of the switch located between the voltage generator 140 and the memory cell array 110. For example, as the switch located between the third wordline WL3 and the first wordline voltage generating unit 141_1 is turned off, the third wordline WL3 may be disconnected from the first wordline voltage generating unit 141_1.

One, which provides the voltage to the selected wordline, from among the wordline voltage generating units 141_1 to 141_n may start to generate a next read voltage after the connection with the selected wordline is released. For example, the first wordline voltage generating unit 141_1 may be controlled such that the third read voltage VR_3 is generated at the a-th point in time ta. That is, at the sixth point in time t66, the first voltage VA and the second voltage VB may be different from each other.

A time period from t66 to t67 may be a second sensing period. Excepting the selected wordline and one, which provides the voltage to the selected wordline, from among the wordline voltage generating units 141_1 to 141_n, an operation of the non-volatile memory device 100 may be the same as the operation of the non-volatile memory device 100 in the sensing period from t54 to t55 described with reference to FIG. 5.

The selected wordline may be again connected to one, which provides the voltage to the selected wordline, from among the wordline voltage generating units 141_1 to 141_n. For example, between the fifth point in time t65 and the sixth point in time t66, the third wordline WL3 and the first wordline voltage generating unit 141_1 may be again connected. Afterwards, the first voltage VA may start to change to the third read voltage VR_3.

In some implementations, the selected wordline may be again connected to the voltage generator 140, based on the operation of the switch located between the voltage generator 140 and the memory cell array 110. For example, as the switch located between the third wordline WL3 and the first wordline voltage generating unit 141_1 is turned on, the third wordline WL3 may be again connected to the first wordline voltage generating unit 141_1.

A time period from t67 to t68 may be a third bitline precharge and dump close period. As in the above operation in the first bitline precharge and dump close period from t61 to t62, the non-volatile memory device 100 may prepare the read operation associated with the third read voltage VR_3.

After the eighth point in time t8, as in the above operation in the time period from t62 to t64, the non-volatile memory device 100 may perform the read operation by using the third read voltage VR_3.

The read operation according to the timing diagram of FIG. 6A is performed based on a scheme where the output of the first wordline voltage generating unit 141_1 is floated once. In this case, like the read method according to an implementation of the present disclosure described with reference to FIG. 5, a total read time may be shortened compared to the prior Art.

FIG. 6B is a timing diagram illustrating the readout operation that the non-volatile memory device 100 according to an implementation of the present disclosure performs by using three read voltages. In a time period from t60 to t62, the non-volatile memory device 100 may perform the same operation as the non-volatile memory device 100 in the same time period of FIG. 6A.

In a first SO develop period from t62 to t63, the non-volatile memory device 100 may perform the SO develop operation associated with the first read voltage VR_1. In the time period from t62 to t63, the first voltage VA and the second voltage VB may be different from each other.

The selected wordline may be disconnected from one, which provides the voltage to the selected wordline, from among the wordline voltage generating units 141_1 to 141_n. For example, the third wordline WL3 may be disconnected from the first wordline voltage generating unit 141_1 in a time period from t62 to ta. In this case, the selected wordline may be floated and may maintain an existing voltage. For example, the first voltage VA may be maintained at the first read voltage VR_1 up to a third point in time t63.

In some implementations, the selected wordline may be disconnected from the voltage generator 140, based on the operation of the switch located between the voltage generator 140 and the memory cell array 110. For example, as the switch located between the third wordline WL3 and the first wordline voltage generating unit 141_1 is turned off, the third wordline WL3 may be disconnected from the first wordline voltage generating unit 141_1.

One, which provides the voltage to the selected wordline, from among the wordline voltage generating units 141_1 to 141_n may start to generate a next read voltage after the connection with the selected wordline is released. For example, the first wordline voltage generating unit 141_1 may be controlled such that the second read voltage VR_2 is generated at the a-th point in time ta. That is, at the third point in time t63, the first voltage VA and the second voltage VB may be different from each other.

In a first sensing period from t63 to t64, the non-volatile memory device 100 may perform the sensing operation associated with the first read voltage VR_1. Excepting the selected wordline and one, which provides the voltage to the selected wordline, from among the wordline voltage generating units 141_1 to 141_n, an operation of the non-volatile memory device 100 may be the same as the operation of the non-volatile memory device 100 in the sensing period from t54 to t55 described with reference to FIG. 5.

In the first sensing period from t63 to t64, the selected wordline may be again connected to one, which provides the voltage to the selected wordline, from among the wordline voltage generating units 141_1 to 141_n. For example, in the first sensing period from t63 to t64, the third wordline WL3 and the first wordline voltage generating unit 141_1 may be again connected. Afterwards, the first voltage VA may start to change to the second read voltage VR_2.

In a second bitline precharge and dump close period from t64 to t65, the non-volatile memory device 100 may prepare the read operation associated with the second read voltage VR_2. Excepting the selected wordline and one, which provides the voltage to the selected wordline, from among the wordline voltage generating units 141_1 to 141_n, an operation of the non-volatile memory device 100 may be the same as the operation in the first bitline precharge and dump close period from t61 to t62. The first voltage VA and the second voltage VB may be maintained at the second read voltage VR_2.

In a second SO develop period from t65 to t66, the non-volatile memory device 100 may perform the SO develop operation associated with the second read voltage VR_2. The first voltage VA and the second voltage VB may be maintained at the second read voltage VR_2. Excepting the selected wordline and one, which provides the voltage to the selected wordline, from among the wordline voltage generating units 141_1 to 141_n, an operation of the non-volatile memory device 100 may be the same as the operation of the non-volatile memory device 100 of the SO develop period from t53 to t54 described with reference to FIG. 5.

In a second sensing period from t66 to t67, the non-volatile memory device 100 may perform the sensing operation associated with the second read voltage VR_2. The first voltage VA and the second voltage VB may be identically maintained at the second read voltage VR_2. Excepting the selected wordline and one, which provides the voltage to the selected wordline, from among the wordline voltage generating units 141_1 to 141_*n*, an operation of the non-volatile memory device 100 may be the same as the operation of the non-volatile memory device 100 in the sensing period from t54 to t55 described with reference to FIG. 5.

In a third bitline precharge and dump close period from t67 to t68, the non-volatile memory device 100 may prepare the read operation associated with the third read voltage VR_3. Excepting the selected wordline and one, which provides the voltage to the selected wordline, from among the wordline voltage generating units 141_1 to 141_*n*, an operation of the non-volatile memory device 100 may be the same as the operation of the non-volatile memory device 100 in the first bitline precharge and dump close period from t61 to t62.

The first voltage VA and the second voltage VB may identically change to a next read voltage. For example, the first voltage VA and the second voltage VB may change the third read voltage VR_3.

After the eighth point in time t68, as in the above operation in the time period from t65 to t67, the non-volatile memory device 100 may perform the read operation by using the third read voltage VR_3.

The read operation according to the timing diagram of FIG. 6B is performed based on a scheme where the output of the first wordline voltage generating unit 141_1 is floated once. In this case, like the read operation method according to an implementation of the present disclosure described with reference to FIG. 5, a total read time may be shortened compared to the prior art.

FIG. 6C is a timing diagram illustrating the readout operation that the non-volatile memory device 100 according to an implementation of the present disclosure performs by using three read voltages. Referring to FIG. 6C, an operation of the non-volatile memory device 100 in a time period from t60 to t65 may be the same as the operation of the non-volatile memory device 100 in the same time period described with reference to FIG. 6B.

An operation of the non-volatile memory device 100 in in a time period from t65 to t68 may be the same as the operation of the non-volatile memory device 100 in the same time period described with reference to FIG. 6A. After the eight time t68, an operation of the non-volatile memory device 100 is same as the non-volatile memory device 100 in the same period described with reference to FIGS. 6A and 6B.

The read operation according to the timing diagram of FIG. 6C is performed based on a scheme where the output of the first wordline voltage generating unit 141_1 is floated two times. In this case, like the read operation method described with reference to FIG. 5, a total read time may be shortened compared to the prior art, and the non-volatile memory device 100 may support the read operation whose total read time is shorter than those of the read operations described with reference to FIGS. 6A and 6B.

Figure 7:
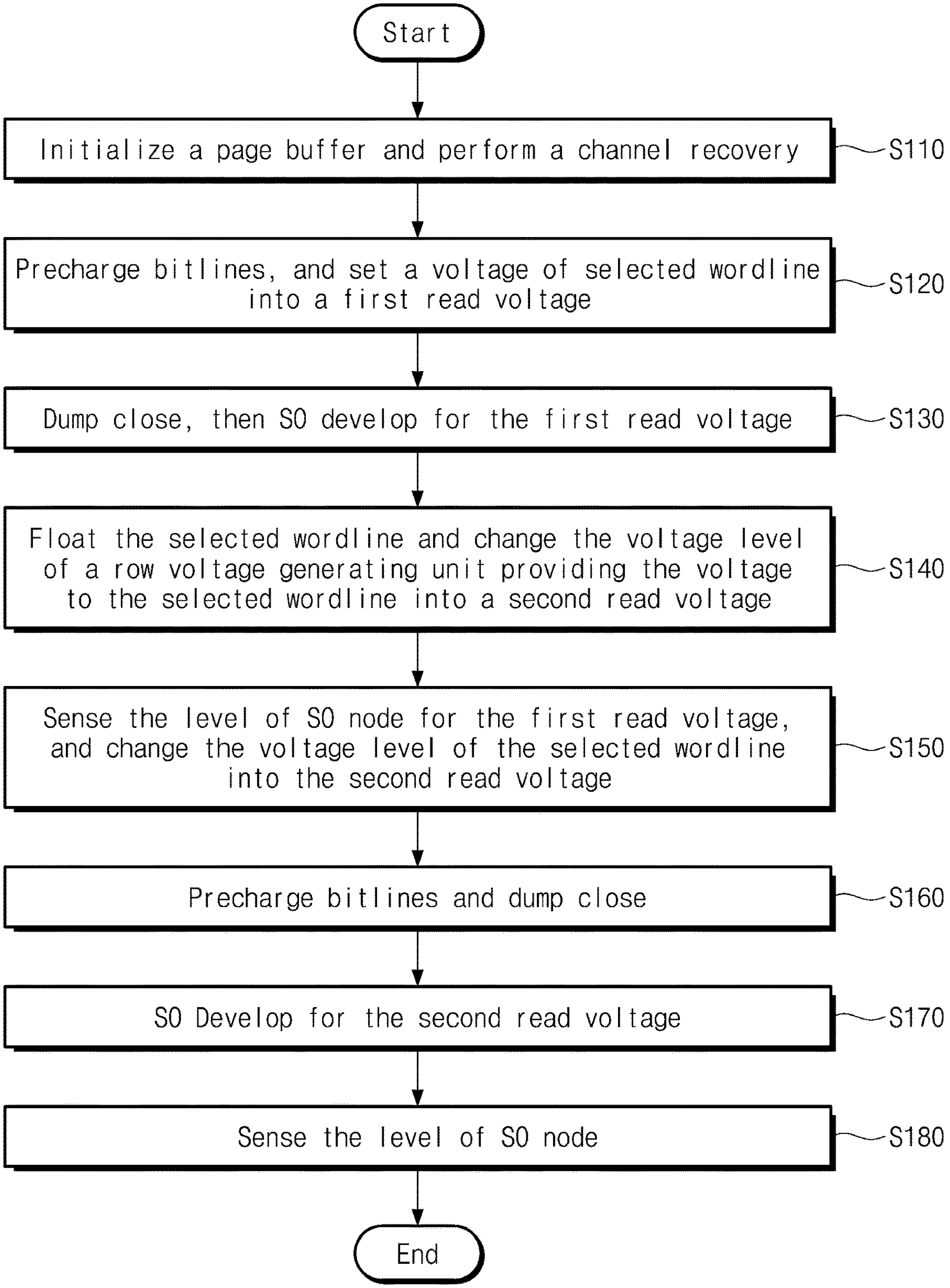
FIG. 7 is a flowchart illustrating a method of a read operation, according to an implementation of the present disclosure.

FIG. 7 is a flowchart illustrating a sequence of a read operation of the non-volatile memory device 100 of FIG. 1, according to an implementation of the present disclosure. A sequence of the read operation that the non-volatile memory device 100 according to an implementation of the present disclosure performs by using two read voltages will be described with reference to FIGS. 1 to 3 and 7.

In operation S110, the non-volatile memory device 100 may perform a page buffer initialization operation. For example, the page buffer initialization operation may be performed within the page buffer circuit 150 based on the page buffer control signal CTRL_PB of the control logic circuit 120 and the page buffer voltages V_PB of the voltage generator 140. In some implementations, the non-volatile memory device 100 may perform a channel recovery operation on the memory cells of FIG. 2A together with the page buffer initialization operation.

In operation S120, the non-volatile memory device 100 may precharge the bitlines BLs and may set a voltage of a selected wordline to a first read voltage. For example, the non-volatile memory device 100 may precharge the bitlines BLs based on the page buffer voltages V_PB of the voltage generator 140. In some implementations, the first read voltage may be one of the read voltages VR1 to VR7 of FIG. 3. However, the present disclosure is not limited thereto. For example, the number of read voltages capable of being selected depending on a kind of memory cells or levels of the read voltages may be variable.

In operation S130, the non-volatile memory device 100 may perform a dump close operation and may then perform the SO develop operation associated with the first read voltage. For example, the non-volatile memory device 100 may perform the dump close operation within the page buffer circuit 150. After the dump close operation is completed, the non-volatile memory device 100 may perform the SO develop operation associated with the first read voltage.

In operation S140, the non-volatile memory device 100 may float the selected wordline in the SO develop operation. For example, when the selected wordline is the third wordline WL3 of FIG. 2A and the first wordline voltage generating unit 141_1 provides a voltage to the third wordline WL3, the non-volatile memory device 100 may disconnect the third wordline WL3 from the first wordline voltage generating unit 141_1 such that the third wordline WL3 is floated.

In some implementations, the selected wordline may be floated based on the operation of the switch located between the voltage generator 140 and the memory cell array 110. For example, as the switch located between the voltage generator 140 and the memory cell array 110 is turned off, the selected wordline may be floated and may maintain the first read voltage.

Next, the non-volatile memory device 100 may change a voltage of one, which provides the voltage to the selected wordline, from among the wordline voltage generating units 141_1 to 141_*n* to a second read voltage. For example, in the same case as the above case, the non-volatile memory device 100 may change the voltage of the first wordline voltage generating unit 141_1 to the second read voltage. In some implementations, the second read voltage may be different from the first read voltage and may be one of the read voltages VR1 to VR7 of FIG. 3.

In operation S150, the non-volatile memory device 100 may perform a sensing operation and may then change the voltage of the selected wordline to the second read voltage. In some implementations, the non-volatile memory device 100 may perform the sensing operation through the sensing latch 151 in the page buffer circuit 150.

The non-volatile memory device 100 may change the voltage of the selected wordline to the second read voltage by connecting the selected wordline with one providing the voltage to the selected wordline from among the wordline voltage generating units 141_1 to 141_*n*. For example, when the selected wordline is the third wordline WL3 of FIG. 2A and the first wordline voltage generating unit 141_1 provides a voltage to the third wordline WL3, the non-volatile memory device 100 may again connect the third wordline WL3 and the first wordline voltage generating unit 141_1.

In this case, the voltage of the selected wordline may start to change to the second read voltage. In some implementations, the selected wordline may be again connected to the voltage generator 140, based on the operation of the switch located between the voltage generator 140 and the memory cell array 110.

In operation S160, the non-volatile memory device 100 may precharge bitlines and may perform a dump close operation. The bitlines may be precharged to be the same as operation S110. The dump close operation may be performed to be the same as the dump close operation in operation S130.

In operation S170, the non-volatile memory device 100 may perform the SO develop operation associated with the second read voltage. An operation of the non-volatile memory device 100 may be performed to be the same as that in operation S130 except that the voltage of the selected wordline is the second read voltage.

In operation S180, the non-volatile memory device 100 may perform the sensing operation with the second read voltage. The sensing operation in operation S180 may be performed to be the same as the sensing operation in operation S150. According to the above operations, the non-volatile memory device 100 may decrease a bitline precharge time in operation S160 compared to the prior art. This may mean that a total read time decreases.

The flowchart of FIG. 7 is associated with the read operation that the non-volatile memory device 100 performs by using two read voltages, and the present disclosure is not limited thereto. The method of the present disclosure may be applied to a read operation that the non-volatile memory device 100 performs by using three read voltages. For example, when the non-volatile memory device 100 performs the read operation by using three read voltages depending on the method according to an implementation of the present disclosure, the non-volatile memory device 100 may operate based on a method where the selected wordline may be floated once or more.

Figure 8A:
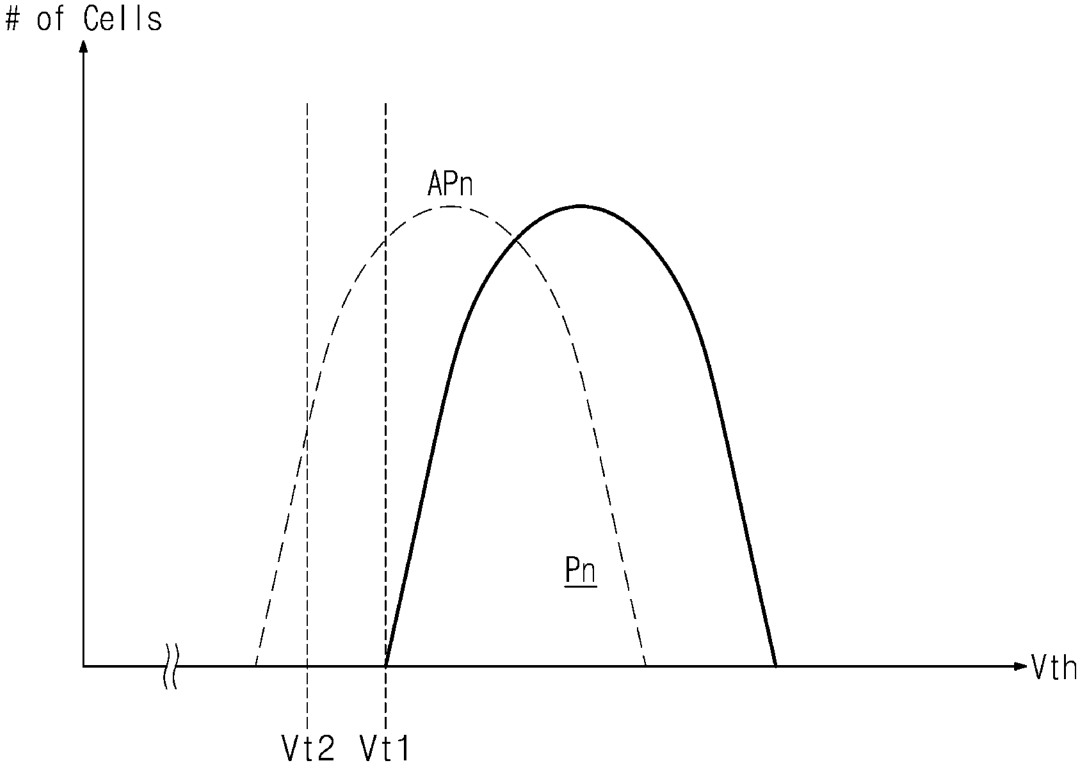
FIGS. 8A and 8B are diagrams illustrating 2-step verifying of a non-volatile memory device, according to an implementation of the present disclosure.
Figure 8B:
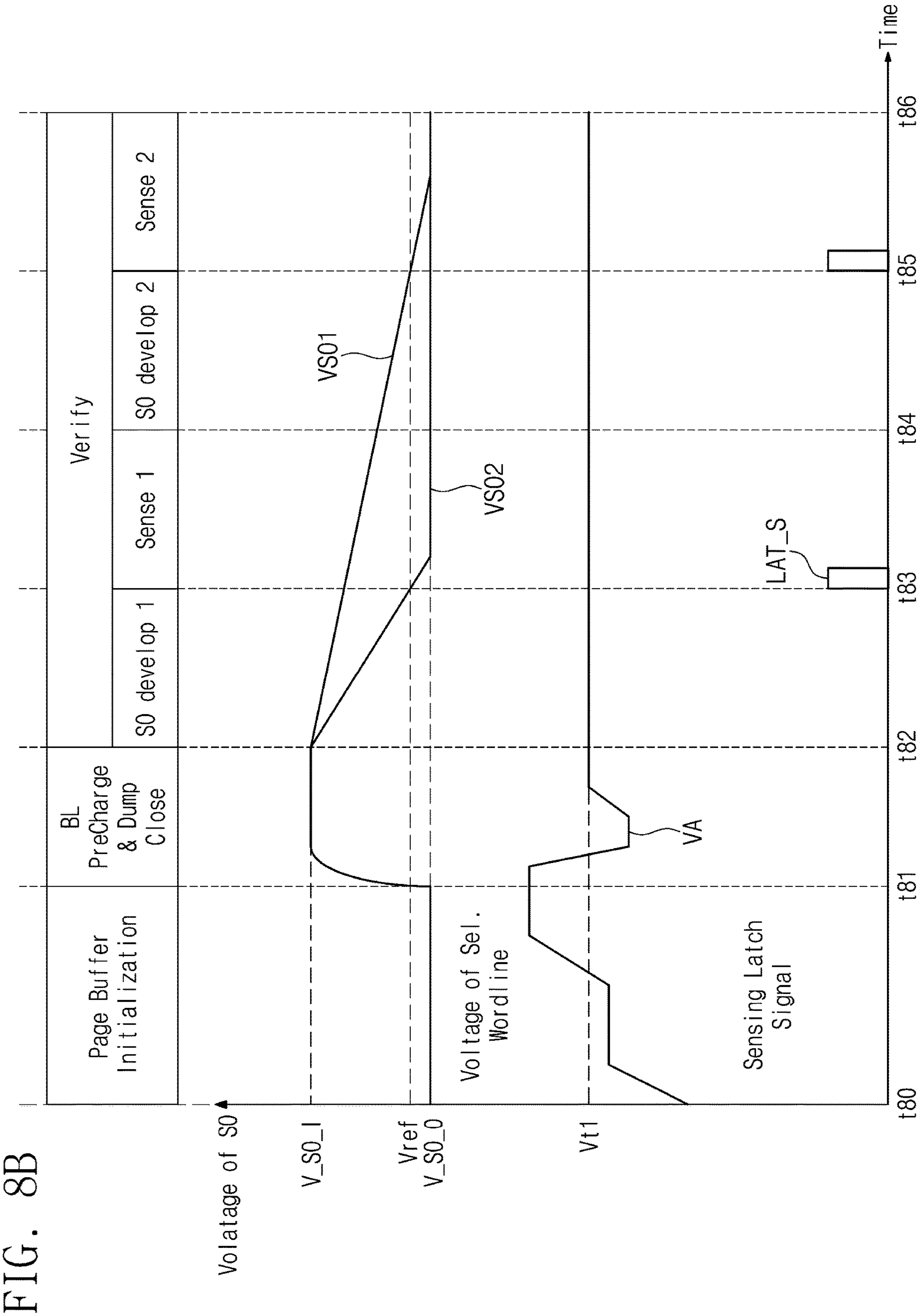

FIGS. 8A and 8B are diagrams illustrating 2-step verifying of a non-volatile memory device, according to an implementation of the present disclosure. 2-step verifying refers to one of schemes to verify whether data programmed in a memory cell belong to an intended threshold voltage range (or distribution) (i.e., one of various verify schemes). FIG. 8A is a diagram illustrating a threshold voltage distribution (hereinafter, referred to as an "actual distribution") APn of actual memory cells, which experience a program process associated with an n-th state Pn and a distribution of the n-th state Pn.

FIG. 8B is a timing diagram illustrating how a voltage of a selected wordline, a voltage of a sensing node, and the sensing latch signal LAT_S of the sensing latch 151 of FIG. 2B change over time in a 2-step verifying process. FIG. 8 may be composed of FIG. 8A and FIG. 8B. 2-step verifying will be described with reference to FIGS. 1 to 3 and 8. Referring to FIG. 8A, a first threshold voltage Vt1 may be greater than a second threshold voltage Vt2.

Referring to FIG. 8A, a lower limit of the actual distribution APn may be formed to be lower than a lower limit of the n-th state Pn. For example, memory cells whose threshold voltages are lower than the lower limit (or the lowest threshold voltage) of the n-th state Pn may be present in the actual distribution APn. The non-volatile memory device 100 may perform the verify operation on a plurality of threshold voltages for the purpose of verifying the actual distribution APn accurately and efficiently. Below, how a voltage level of the sensing node SO changes and how 2-step verifying is performed based on the change in the voltage level of the sensing node SO will be described with reference to FIGS. 1 to 3 and 8B.

How voltages VSO1 and VSO2 of the sensing nodes SO connected to memory cells having the threshold voltages Vt1 and Vt2 of FIG. 8A change when the same wordline voltage is applied to the memory cells are illustrated in FIG. 8B. The first sensing node voltage VSO1 may refer to a voltage of the sensing node SO connected to a memory cell having the first threshold voltage Vt1. The second sensing node voltage VSO2 may refer to a voltage of the sensing node SO connected to a memory cell having the second threshold voltage Vt2.

For convenience of description, it is assumed that the third wordline WL3 among the wordlines WL1 to WL4 of FIG. 3 is a selected wordline. A voltage of the selected wordline is referred to as a "first voltage VA". FIG. 8B shows an example in which data are sensed based on a change in a voltage level of the sensing node SO, and the present disclosure is not limited thereto. For example, a current level-based data sensing scheme may also be included in the scope and spirit of the invention.

A time period from t80 to t81 may be a page buffer initialization period. For example, a change in the first voltage VA of the selected wordline may be the same as the change in the first voltage VA in the page buffer initialization period from t50 to t51 of the non-volatile memory device 100 described with reference to FIG. 5.

In the page buffer initialization period from t80 to t81, the voltage of the sensing node SO may be maintained at an initial SO voltage V_SO_0. For example, the initial SO voltage V_SO_0 may be a voltage of the sensing node SO after the SO develop operation is completed.

A time period from t81 to t82 may be a bitline precharge and dump close period. The bitlines BLs may be charged with charges based on the page buffer voltages V_PB. In some implementations, potential levels of the sensing nodes SO connected to the bitlines BLs may increase. For example, referring to FIG. 8B, the sensing node SO may increase to an initial SO voltage V_SO_I. An increasing shape of the voltage of the sensing node SO illustrated in FIG. 8B is provided as an example, and the present disclosure is not limited thereto.

In some implementations, the first voltage VA of the selected wordline may change to a voltage for verifying a program state of memory cells. For example, referring to FIG. 8B, the first voltage VA of the selected wordline may change to the first threshold voltage Vt1 that makes it possible to verify whether a memory cell is programmed to store data of a first state. The first threshold voltage Vt1 may be the same as the lowest threshold voltage (or the lower limit voltage) of the n-th state Pn of FIG. 8A. Excepting the above description, an operation of the non-volatile memory device 100 in the time period from t81 to t82 may be the same as the operation of the non-volatile memory device 100 in the time period from t61 to t62 described with reference to FIG. 6A.

A time period from t82 to t86 may be a verify period. The non-volatile memory device 100 may perform the sensing operation two times in the verify period. That is, 2-step verifying may be performed with respect to the program state of the memory cells.

When the first threshold voltage Vt1 is greater than the second threshold voltage Vt2, a speed at which the first sensing node voltage VSO1 decreases may be slower than a speed at which the second sensing node voltage VSO2 decreases. The reason is that a discharge speed of the sensing node increases as a difference between the wordline voltage applied to the memory cells and threshold voltages of the memory cells becomes greater.

A time period from t82 to t83 may be a first SO develop period. The non-volatile memory device 100 may start the SO develop operation. Excepting the selected wordline, an operation of the non-volatile memory device 100 may be the same as the operation of the non-volatile memory device 100 in the first SO develop period from t62 to t63 described with reference to FIG. 6A.

A time period from t83 to t84 may be a first sensing period. The non-volatile memory device 100 may sense a level of the sensing node SO through the sensing latch 151.

Referring to FIG. 8B, at the third point in time t83, the sensing latch signal LAT_S may have a positive edge. The non-volatile memory device 100 may continue the SO develop operation in the first sensing period from t83 to t84.

As the sensing latch signal LAT_S transitions to the high level, through the sensing latch 151, the non-volatile memory device 100 may store, through the sensing latch 151, information about whether the potential level of the sensing node SO is higher or lower than a reference voltage level Vref. For example, at the third point in time t83, with regard to the second threshold voltage Vt2, the non-volatile memory device 100 may store information about whether the potential level of the sensing node SO is higher or lower than the reference voltage level Vref.

A time period from t84 to t85 may be a second SO develop period. In this case, the non-volatile memory device 100 may identically perform the operation in the first SO develop period from t82 to t83.

A time period from t85 to t86 may be a second sensing period. The non-volatile memory device 100 may sense the level of the sensing node SO through the sensing latch 151.

Referring to FIG. 8B, the sensing latch signal LAT_S may have a positive edge at the fifth point in time t85. In the second sensing period from t85 to t86, the non-volatile memory device 100 may continue the SO develop operation.

As the sensing latch signal LAT_S transitions to the high level, through the sensing latch 151, the non-volatile memory device 100 may store information about whether the potential level of the sensing node SO is higher or lower than the reference voltage level Vref. For example, at the fifth point in time t85, with regard to the first threshold voltage Vt1, the non-volatile memory device 100 may store information about whether the potential level of the sensing node SO is higher or lower than the reference voltage level Vref.

The non-volatile memory device 100 may verify the program state of the memory cells based on the above method. Below, how a voltage of a selected wordline changes in a 2-step verify operation of the non-volatile memory device 100 according to an implementation of the present disclosure will be described with reference to FIG. 9.

Figure 9:
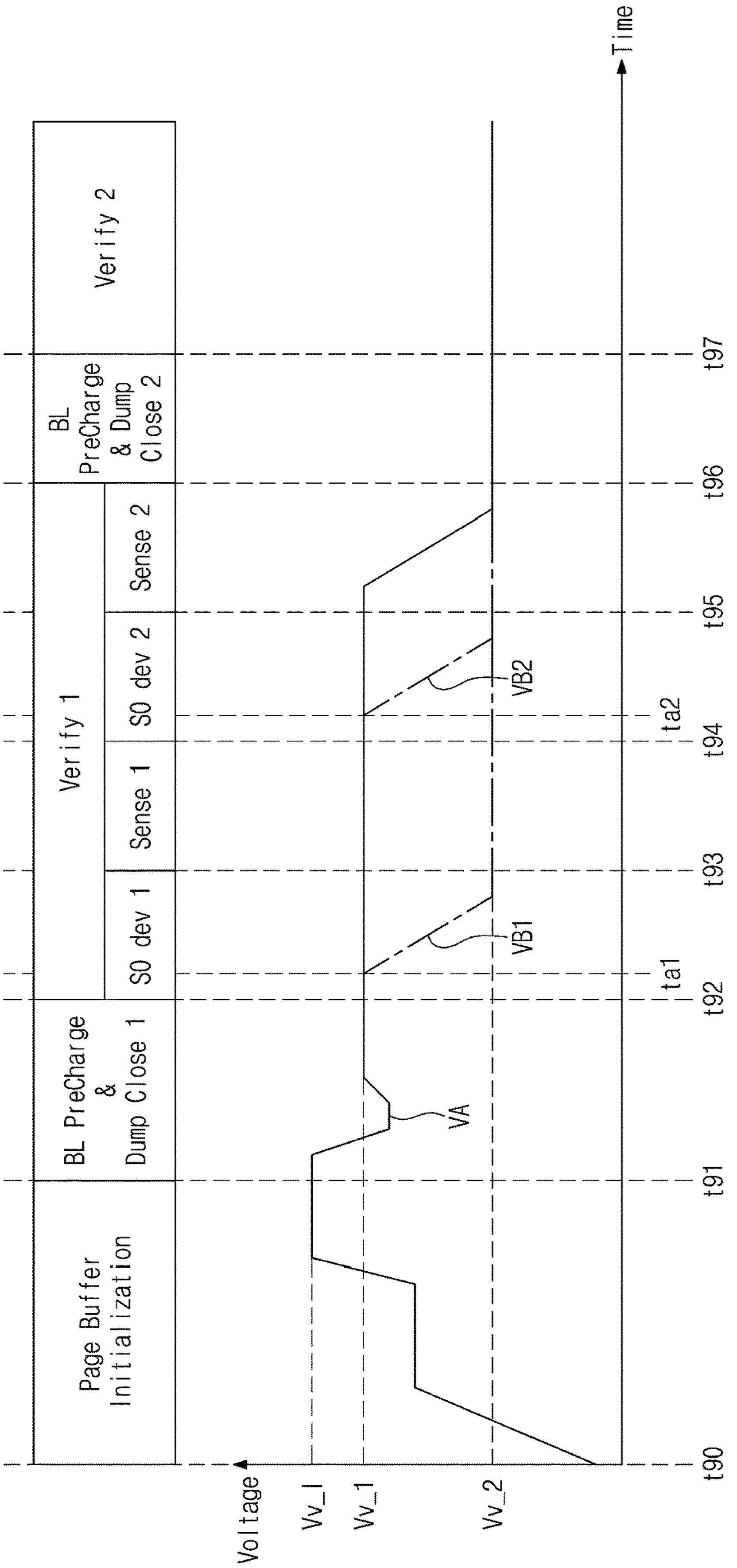
FIG. 9 is a timing diagram illustrating how a voltage of a selected wordline of a non-volatile memory device and a voltage of one providing a voltage to the selected wordline from among row voltage generating units change over time when a 2-step verify operation is performed by using a plurality of verify voltages, according to an implementation of the present disclosure.

FIG. 9 is a timing diagram illustrating how a voltage of a selected wordline of the non-volatile memory device 100 and a voltage of one providing a voltage to the selected wordline from among the wordline voltage generating units 141_1 to **141_*n* change over time when a 2-step verify operation is performed with respect to two states (e.g., two of the program states P1 to P7 of FIG. 3) of memory cells of FIG. 2A, according to an implementation of the present disclosure. How the non-volatile memory device 100 performs a 2-step verify operation on a plurality of states of memory cells will be described with reference to FIGS. 1 to 3 and 9**.

For convenience of description, it is assumed that a selected wordline is the third wordline WL3 of FIG. 2A and the first wordline voltage generating unit 141_1 provides a voltage to the selected wordline. A voltage of the selected wordline is referred to as a "first voltage VA" and is shown as a solid line. A voltage of one providing the voltage to the selected wordline from among the wordline voltage generating units 141_1 to **141_*n* is referred to as a "second voltage VB1" and a "second voltage VB2". The second voltage VB1 and the second voltage VB2 may be different in that there is differently set a point in time when one providing the voltage to the selected wordline from among the wordline voltage generating units 141_1 to 141_*n* is floated. A portion of the second voltage VB1 and the second voltage VB2, which is the same as the first voltage VA, is shown as a straight line, and a portion of the second voltage VB1 and the second voltage VB2**, which is different from the first voltage VA, is shown as a dash-single dotted line.

A first verify voltage Vv_1 may be one of the verify voltages Vv1 to Vv7 of FIG. 3. A second verify voltage Vv_2 may be one of the verify voltages Vv1 to Vv7 of FIG. 3 and may be different from the first verify voltage Vv_1. An example in which the first verify voltage Vv_1 is higher than the second verify voltage Vv_2 is illustrated in FIG. 9. This is provided as an example, and the present disclosure is not limited thereto.

Referring to FIG. 9, a time period from t90 to t91 may be a page buffer initialization period. The first voltage VA and the second voltages VB1 and VB2 may identically change in the page buffer initialization period from t90 to t91. In some implementations, the first voltage VA and the second voltages VB1 and VB2 may change such that channels of memory cells in the plurality of cell strings CS11, CS2, CS12, CS22, C13, and CS23 of FIG. 2A are initialized. For example, the first voltage VA and the second voltages VB1 and VB2 may increase to an initialization voltage Vv_I, and the initialization voltage Vv_I may be the pass voltage Vpass of FIG. 3.

A time period from t91 to t92 may be a first bitline precharge and dump close period. All of the first voltage VA and the second voltages VB1 and VB2 may change to the first verify voltage Vv_1.

The change in the first voltage VA and the second voltages VB1 and VB2 in the time period from t90 to t92 is provided as an example, and the present disclosure is not limited thereto. Excepting the above description, an operation of the non-volatile memory device 100 may be the same as the operation of the non-volatile memory device 100 in the first bitline precharge and dump close period from t81 to t82 described with reference to FIG. 8B.

A time period from t92 to t96 may be a first verify period. The non-volatile memory device 100 may perform the 2-step verify operation by using the first verify voltage Vv_1 in the first verify period. In the first verify period from t92 to t96, an operation of the non-volatile memory device 100 will be described for each of the second voltages VB1 and VB2.

A time period from t92 to t93 may be a first SO develop period. The non-volatile memory device 100 may perform the SO develop operation in the first SO develop period from t92 to t93. Excepting the selected wordline and one providing the voltage to the selected wordline from among the wordline voltage generating units_1 to **141_*n*, an operation of the non-volatile memory device 100 may be the same as the operation of the non-volatile memory device 100 in the first SO develop period from t62 to t63 described with reference to FIG. 6**.

The second voltage VB2 and the first voltage VA may be identically maintained at the first verify voltage Vv_1 in the time period from t92 to t93. In the first SO develop period from t92 to t93, the first voltage VA may be different from the second voltage VB1.

In the case of the second voltage VB1, in an implementation, the selected wordline may be disconnected from one, which provides the voltage to the selected wordline, from among the wordline voltage generating units 141_1 to 141_n. For example, the third wordline WL3 may be disconnected from the first wordline voltage generating unit 141_1 in a time period from t92 to ta1. In this case, the selected wordline may be floated and may maintain an existing voltage. For example, the first voltage VA may be maintained at the first verify voltage Vv_1 up to the third point in time t63.

In some implementations, the selected wordline may be disconnected from the voltage generator 140, based on the operation of the switch located between the voltage generator 140 and the memory cell array 110. For example, as the switch located between the third wordline WL3 and the first wordline voltage generating unit 141_1 is turned off, the third wordline WL3 may be disconnected from the first wordline voltage generating unit 141_1.

In some implementations, after one, which provides the voltage to the selected wordline, from among the wordline voltage generating units 141_1 to 141_n is disconnected from the selected wordline, the one wordline voltage generating unit may start to generate a next verify voltage. For example, the first wordline voltage generating unit 141_1 may start to generate the second verify voltage Vv_2 at the a1-th point in time ta1.

A time period from t93 to t94 may be a first sensing period. Excepting the selected wordline and one, which provides the voltage to the selected wordline, from among the wordline voltage generating units 141_1 to 141_n, an operation of the non-volatile memory device 100 may be the same as the operation of the non-volatile memory device 100 in the first sensing period from t83 to t84 described with reference to FIG. 8B.

At the fourth point in time t94, the first voltage VA may continuously maintain the first verify voltage Vv_1. The second voltage VB1 that is different from the first voltage VA may reach the second verify voltage Vv_2 being a next verify voltage and may then maintain the second verify voltage Vv_2. Like the first voltage VA, the second voltage VB2 may identically maintain the first verify voltage Vv_1.

A time period from t94 to t95 may be a second SO develop period in which the non-volatile memory device 100 continues the SO develop operation. Excepting the selected wordline and one, which provides the voltage to the selected wordline, from among the wordline voltage generating units 141_1 to 141_n, an operation of the non-volatile memory device 100 may be the same as the operation in the first SO develop period from t92 to t93.

In the second SO develop period from t94 to t95, the first voltage VA may maintain the first verify voltage Vv_1, and the second voltage VB1 may maintain the second verify voltage Vv_2. A change in the second voltage VB2 may be the same as the change in the second voltage VB1 in the first SO develop period from t92 to t93. That is, the second voltage VB2 may start to change to the second verify voltage Vv_2.

A time period from t95 to t96 may be a second sensing period. Excepting the selected wordline and one, which provides the voltage to the selected wordline, from among the wordline voltage generating units 141_1 to 141_n, an operation of the non-volatile memory device 100 may be the same as the operation of the non-volatile memory device 100 in the second sensing period from t85 to t86 described with reference to FIG. 8B.

In some implementations, the selected wordline may be again connected to one, which provides the voltage to the selected wordline, from among the wordline voltage generating units 141_1 to 141_n. For example, the third wordline WL3 may be again connected to the first wordline voltage generating unit 141_1 in the second sensing period from t95 to t96. In this case, the first voltage VA may start to change to the second verify voltage Vv_2.

In some implementations, the selected wordline may be again connected to the voltage generator 140, based on the operation of the switch located between the voltage generator 140 and the memory cell array 110. For example, as the switch located between the third wordline WL3 and the first wordline voltage generating unit 141_1 is turned on, the third wordline WL3 may be again connected to the first wordline voltage generating unit 141_1.

A time period from t96 to t97 may be a second bitline precharge and dump close period. Excepting the selected wordline and the first wordline voltage generating unit 141_1, an operation of the non-volatile memory device 100 may be the same as the operation in first bitline precharge and dump close period from t91 to t92.

A second verify period may start from the seventh point in time t97. All of the first voltage VA and the second voltages VB1 and VB2 may be identically maintained at the second verify voltage Vv_2. In the corresponding period, an operation of the non-volatile memory device 100 may be the same as the operation in the verify period from t82 to t85 described with reference to FIG. 8B; in this case, the non-volatile memory device 100 may verify the program state of the memory cells by using the second verify voltage Vv_2.

According to the operation of the non-volatile memory device 100 described with reference to FIG. 9, a change of a verify voltage of a selected wordline starts in a second sensing period, and thus, a time taken to change a voltage of the selected wordline in a bitline precharge period may decrease. That is, a time taken to perform a verify operation on a plurality of program states may be shortened compared to the prior art.

The case where a verify operation is performed with respect to two states of memory cells is illustrated in FIG. 9, and the present disclosure is not limited thereto. For example, a verify scheme in which a verify operation is performed with respect to three or more states of memory cells may also be included in the scope and spirit of the invention. In this case, in the verify periods of the remaining states other than the last state, an operation of the non-volatile memory device 100 may be similar to that in the first verify period from t92 to t96 of FIG. 9.

Figure 10:
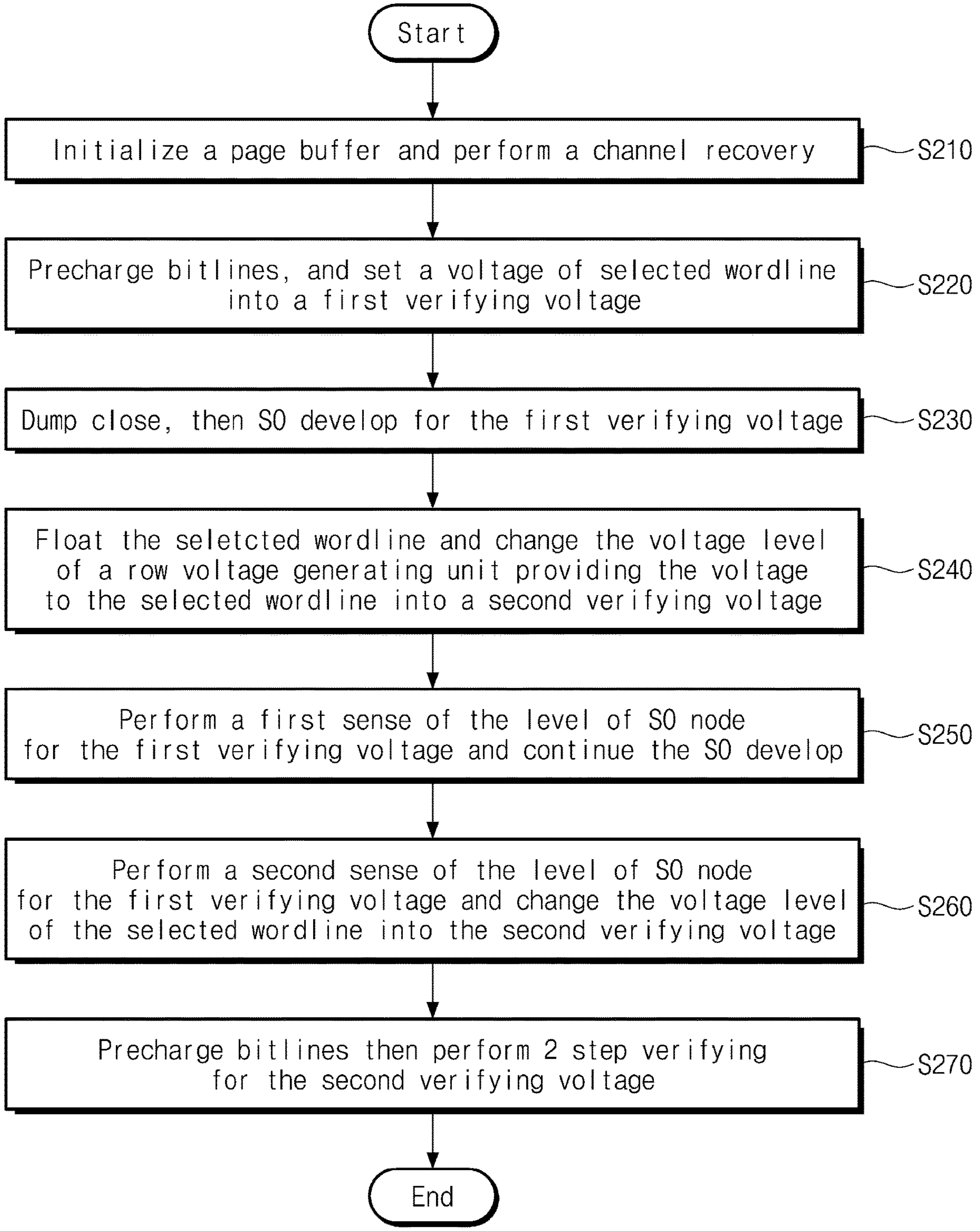
FIG. 10 is a flowchart illustrating a 2-step verifying process of a nonvolatile memory device of FIG. 1, according to an implementation of the present disclosure.

FIG. 10 is a flowchart illustrating a 2-step verifying process of the non-volatile memory device 100 of FIG. 1, according to an implementation of the present disclosure. An operation of the non-volatile memory device 100 according to the first voltage VA and the second voltage VB1 of FIG. 9 will be described with reference to FIG. 10. However, the present disclosure is not limited thereto. For example, an implementation in which a voltage of a row voltage generator changes with respect to the second voltage VB2 may also be included in the scope and spirit of the invention. A 2-step verify operation that the non-volatile memory device 100 according to an implementation of the present disclosure performs by using a plurality of voltages will be described with reference to FIGS. 1, 3, and 10.

In operation S210, the non-volatile memory device 100 may perform a page buffer initialization operation and a channel recovery operation. Operation S210 may be the same as operation S110 of FIG. 7.

In operation S220, the non-volatile memory device 100 may precharge the bitlines BLs and may set a voltage of a selected wordline to a first verify voltage. For example, the non-volatile memory device 100 may precharge the bitlines BLs based on the page buffer voltages V_PB of the voltage generator 140. In some implementations, the first verify voltage may be one of the verify voltages Vv1 to Vv7 of FIG. 3. However, the present disclosure is not limited thereto. For example, the number of verify voltages capable of being selected or levels of the verify voltages may be variable depending on a kind of memory cells.

In operation S230, the non-volatile memory device 100 may perform a dump close operation and may then perform an SO develop operation associated with the first verify voltage. For example, the non-volatile memory device 100 may perform the dump close operation within the page buffer circuit 150. After the dump close operation is completed, the non-volatile memory device 100 may perform the SO develop operation.

In operation S240, the non-volatile memory device 100 may float the selected wordline in the SO develop operation. For example, when the selected wordline is the third wordline WL3 of FIG. 2A and the first wordline voltage generating unit 141_1 provides a voltage to the third wordline WL3, the non-volatile memory device 100 may disconnect the third wordline WL3 from the first wordline voltage generating unit 141_1 such that the third wordline WL3 is floated. In some implementations, the selected wordline may be floated based on the operation of the switch located between the voltage generator 140 and the memory cell array 110. For example, as the switch is turned off, the selected wordline may be floated and may maintain the first verify voltage.

Next, the non-volatile memory device 100 may change a voltage of one, which provides the voltage to the selected wordline, from among the row voltage generating units 141_1 to 141_*n* to a second verify voltage. For example, in the same case as the above case, the non-volatile memory device 100 may change the voltage of the first wordline voltage generating unit 141_1 to the second verify voltage. In some implementations, the second verify voltage that is different from the first verify voltage may be one of the verify voltages Vv1 to Vv7 of FIG. 3.

In operation S250, the non-volatile memory device 100 may perform a first sensing operation and may continue the SO develop operation. In some implementations, the first sensing operation may be performed through the sensing latch 151 in the page buffer circuit 150. In this case, with regard to a first threshold voltage, the non-volatile memory device 100 may store, through the sensing latch 151, information about whether the level of the sensing node SO is higher or lower than a reference level.

In operation S260, the non-volatile memory device 100 may perform a second sensing operation. In some implementations, the second sensing operation may be performed based on an operation of the sensing latch 151 in the page buffer circuit 150. In this case, with regard to a second threshold voltage, the non-volatile memory device 100 may store, through the sensing latch 151, information about whether the level of the sensing node SO is higher or lower than the reference level.

Next, the non-volatile memory device 100 may change the voltage of the selected wordline to the second verify voltage. The non-volatile memory device 100 may change the voltage of the selected wordline to the second verify voltage by connecting the selected wordline with one providing the voltage to the selected wordline from among row voltage generating units. For example, when the selected wordline is the third wordline WL3 of FIG. 2A and the first wordline voltage generating unit 141_1 provides a voltage to the third wordline WL3, the non-volatile memory device 100 may change a voltage of the third wordline WL3 to the second verify voltage by connecting the third wordline WL3 with the first wordline voltage generating unit 141_1.

In some implementations, the selected wordline may be again connected to the voltage generator 140, based on the operation of the switch located between the voltage generator 140 and the memory cell array 110. For example, as the switch is turned on, the selected wordline may be again connected to one providing the voltage to the selected wordline from among row voltage generating units and may start to change the second verify voltage.

In operation S270, the non-volatile memory device 100 may perform a bitline precharge operation and may then perform a 2-step verify operation associated with a state corresponding to the second verify voltage. In operation S270, the non-volatile memory device 100 may perform the bitline precharge operation to be the same as the bitline precharge operation performed in operation S220. The non-volatile memory device 100 may perform the verify operation associated with the second verify voltage. In some implementations, the non-volatile memory device 100 may perform the verify operation associated with the second verify voltage based on a scheme where a sensing operation is performed two times in the SO develop process.

FIG. 10 shows the case where verifying is performed with respect to two program states. However, the present disclosure is not limited thereto. For example, the case where verifying is performed with respect to three or more program states may also be included in the scope and spirit of the invention. For example, in the case where verifying is performed with respect to three or more program states, the non-volatile memory device 100 may perform the verify operation associated with three verify voltages by performing operation S210 to operation S260 with respect to the first verify voltage and performing operation S220 to operation S270 with respect to the second verify voltage and the third verify voltage.

Figure 11:
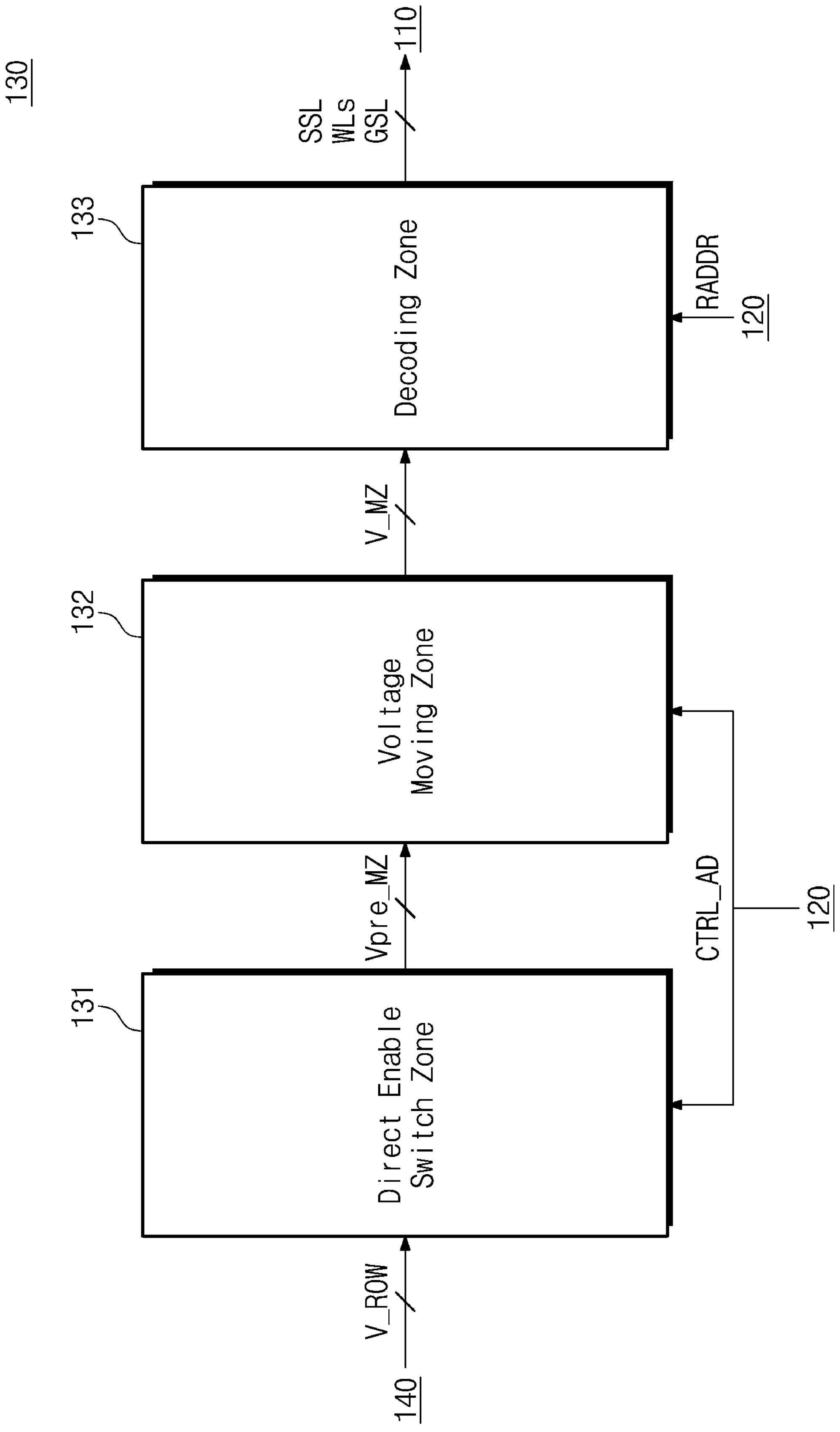
FIG. 11 is a diagram illustrating an address decoder of FIG. 1 in detail, according to an implementation of the present disclosure.

FIG. 11 is a diagram illustrating the address decoder 130 of FIG. 1 in detail, according to an implementation of the present disclosure. Referring to FIG. 11, the address decoder 130 may include a direct enable switch zone 131, a voltage moving zone 132, and a decoding zone 133. An operation of the address decoder 130 according to an implementation of the present disclosure will be described with reference to FIG. 11.

Referring to FIGS. 1 and 11, the direct enable switch zone 131 may be located between the voltage generator 140 and the voltage moving zone 132. In some implementations, the direct enable switch zone 131 may operate under control of the control logic circuit 120. For example, the direct enable switch zone 131 may operate in response to the address decoder control signal CTRL_AD received from the control logic circuit 120.

The direct enable switch zone 131 may transfer the row voltages V_ROW of the voltage generator 140 to the voltage moving zone 132. In some implementations, the number of row voltages V_ROW that the direct enable switch zone 131 receives from the voltage generator 140 may vary depending on an operation scheme of the non-volatile memory device 100.

The direct enable switch zone 131 may determine whether to transfer the row voltages V_ROW to the voltage moving zone 132. In some implementations, the direct enable switch zone 131 may inhibit at least one of the row voltages V_ROW of the voltage generator 140 from being transferred to the voltage moving zone 132. For example, referring to FIGS. 1, 2, 5, and 11, the direct enable switch zone 131 may inhibit one, which is provided to the selected wordline, from among the row voltages V_ROW from being transferred to the voltage moving zone 132 in the SO develop period from t53 to t54 of FIG. 5 such that the selected wordline is floated.

For another example, the direct enable switch zone 131 may allow one, which is provided to the selected wordline, from among the row voltages V_ROW to be transferred to the voltage moving zone 132 in the sensing period from t54 to t54 of FIG. 5 such that the voltage of the selected wordline changes to a next read voltage. The direct enable switch zone 131 will be described in detail with reference to FIGS. 12A and 12B.

The voltage moving zone 132 may transfer a voltage Vpre_MZ provided from the direct enable switch zone 131 to the decoding zone 133. In some implementations, the voltage moving zone 132 may operate under control of the control logic circuit 120. For example, as illustrated in FIG. 11, the voltage moving zone 132 may operate in response to the address decoder control signal CTRL_AD received from the control logic circuit 120.

The decoding zone 133 may transfer a voltage V_MZ provided from the voltage moving zone 132 to the memory cell array 110. In some implementations, based on the row address RADDR, the decoding zone 133 may provide voltages necessary for the string selection line SSL, the wordlines WLs, and the ground selection line GSL. For example, referring together to FIGS. 2A and 11, when the non-volatile memory device 100 performs the read operation with respect to the third wordline WL3, based on the row address RADDR, the decoding zone 133 may provide a read voltage (e.g., one of the read voltages VR1 to VR7 of FIG. 3) provided from the voltage moving zone 132 to the third wordline WL3 and may provide a pass voltage (e.g., Vpass of FIG. 3) to the remaining wordlines. The decoding zone 133 may provide a turn-on voltage of the string selection transistor SST and the ground selection transistor GST to the string selection line SSL and the ground selection line GSL, based on the row address RADDR.

Figure 12A:
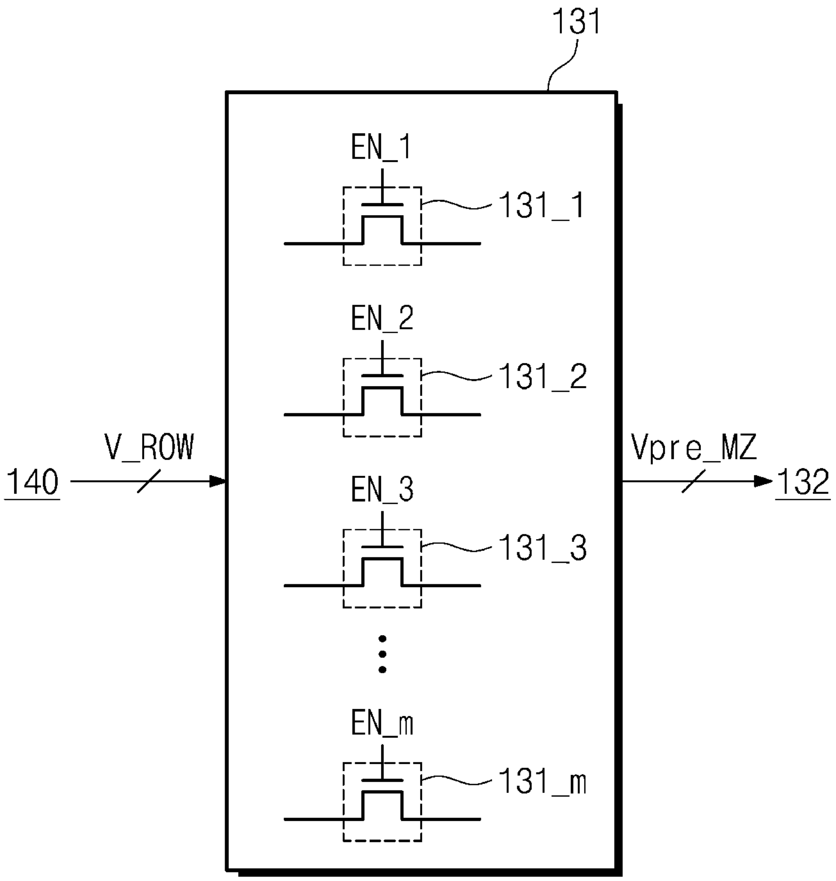
FIGS. 12A and 12B are diagrams illustrating a direct enable switch zone FIG. 11 in detail, according to an implementation of the present disclosure.
Figure 12B:
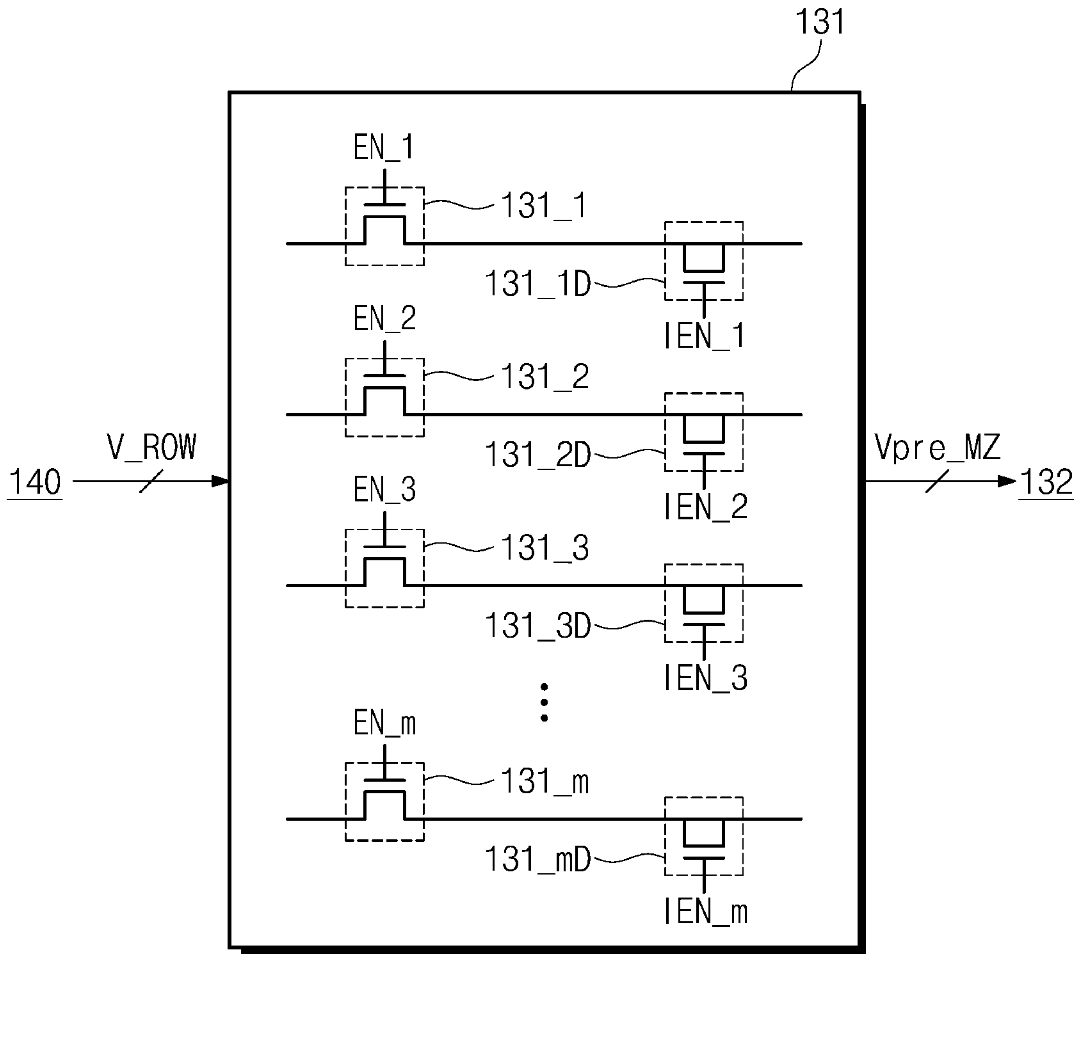

FIGS. 12A and 12B are diagrams illustrating the direct enable switch zone 131 of FIG. 11 in detail, according to an implementation of the present disclosure. A structure and an operation of the direct enable switch zone 131 will be described with reference to FIGS. 12A and 12B.

Referring to FIGS. 1, 11, and 12A, the direct enable switch zone 131 may include a plurality of direct enable switches 131_1 to 131_*m*. In some implementations, the plurality of direct enable switches 131_1 to 131_*m* may be connected between the row voltage generating units 141_1 to 141_*n*, 141_*s*, and 141_*g*, which are sub-components of the row voltage generator 141 of the voltage generator 140 of FIG. 1, and the voltage moving zone 132.

In some implementations, the plurality of direct enable switches 131_1 to 131_*m* may be located only between the wordline voltage generating units 141_1 to 141_*n* and the voltage moving zone 132. In this case, the direct enable switch zone 131 may control whether to transfer only wordline voltages and may transfer a string selecting voltage and a ground selecting voltage to the voltage moving zone 132 without a control.

In some implementations, the plurality of direct enable switches 131_1 to 131_*m* may operate based on corresponding enable signals EN_1 to EN_m. The plurality of enable signals EN_1 to EN_m may be generated based on the address decoder control signal CTRL_AD. For example, the first direct enable switch 131_1 may be turned on or turned off in response to the first enable signal EN_1.

When the direct enable switches 131_1 to 131_*m* are turned on, opposite ends of each of the direct enable switches 131_1 to 131_*m* may have the same voltage. When the direct enable switches 131_1 to 131_*m* are turned off, opposite ends of each of the direct enable switches 131_1 to 131_*m* may have different voltages. That is, when one corresponding to a selected wordline from among the direct enable switches 131_1 to 131_*m* is turned off, the selected wordline may be floated.

In some implementations, the plurality of direct enable switches 131_1 to 131_*m* may respectively include MOSFETs (e.g., NMOS or PMOS transistors) that are connected between the voltage generator 140 and the voltage moving zone 132 and include gate nodes respectively receiving the enable signals EN_1 to EN_m. In some implementations, the number of direct enable switches 131_1 to 131_*m* may be determined based on the number of row voltage generating units 141_1 to 141_*n*, 141_*s*, and 141_*g* being subcomponents of the voltage generator 140 or based on an operation scheme of the non-volatile memory device 100. For example, when the direct enable switches 131_1 to 131_*m* are respectively connected to the wordline voltage generating units 141_1 to 141_*n* and are not connected to the string selecting voltage generating unit 141_*s* and the ground selecting voltage generating unit 141_*g*, the number of direct enable switches 131_1 to 131_*m* may be equal to the number or wordline voltage generating units 141_1 to 141_*n*.

Referring to FIG. 12B, the direct enable switch zone 131 may include the plurality of direct enable switches 131_1 to 131_*m* and a plurality of decoupling switches 131_1D to 131_mD. Referring to FIGS. 1, 11, and 12B, the plurality of direct enable switches 131_1 to 131_*m* may be connected between the voltage generator 140 and the plurality of decoupling switches 131_1D to 131_mD corresponding thereto.

The plurality of decoupling switches 131_1D to 131_mD may be connected between the plurality of direct enable switches 131_1 to 131_*m* and the voltage moving zone 132. In some implementations, as well as a switch, a connection means may be present between opposite ends of each of the plurality of decoupling switches 131_1D to 131_mD. For example, the opposite ends of each of the plurality of decoupling switches 131_1D to 131_mD may be connected by a conductive line. That is, even though the decoupling switches 131_1D to 131_mD are turned off, the opposite ends of each of the decoupling switches 131_1D to 131_mD may have the same potential.

The decoupling switches 131_1D to 131_mD may operate based on inverse enable signals IEN_1 to IEN_m corresponding thereto. In some implementations, the inverse enable signals IEN_1 to IEN_m may be inverse signals of the enable signals EN_1 to EN_m. For example, the inverse enable signals IEN_1 to IEN_m may be inverse signals whose phases are opposite to those of the enable signals EN_1 to EN_m. When the decoupling switches 131_1D to 131_mD are turned on, voltages that are provided to the memory cell array 110 may be prevented from finely changing due to the operation of the direct enable switches 131_1 to 131_*m*.

In some implementations, the decoupling switches 131_1D to 131_mD may include MOSFETs (e.g., NMOS or PMOS transistors) that are connected between the corresponding direct enable switches 131_1 to 131_*m* and the voltage moving zone 132 and include gate nodes respectively receiving the corresponding inverse enable signals IEN_1 to IEN_m. In some implementations, the number of decoupling switches 131_1D to 131_mD may be equal to the number of direct enable switches 131_1 to 131_*m*.

Figure 13:
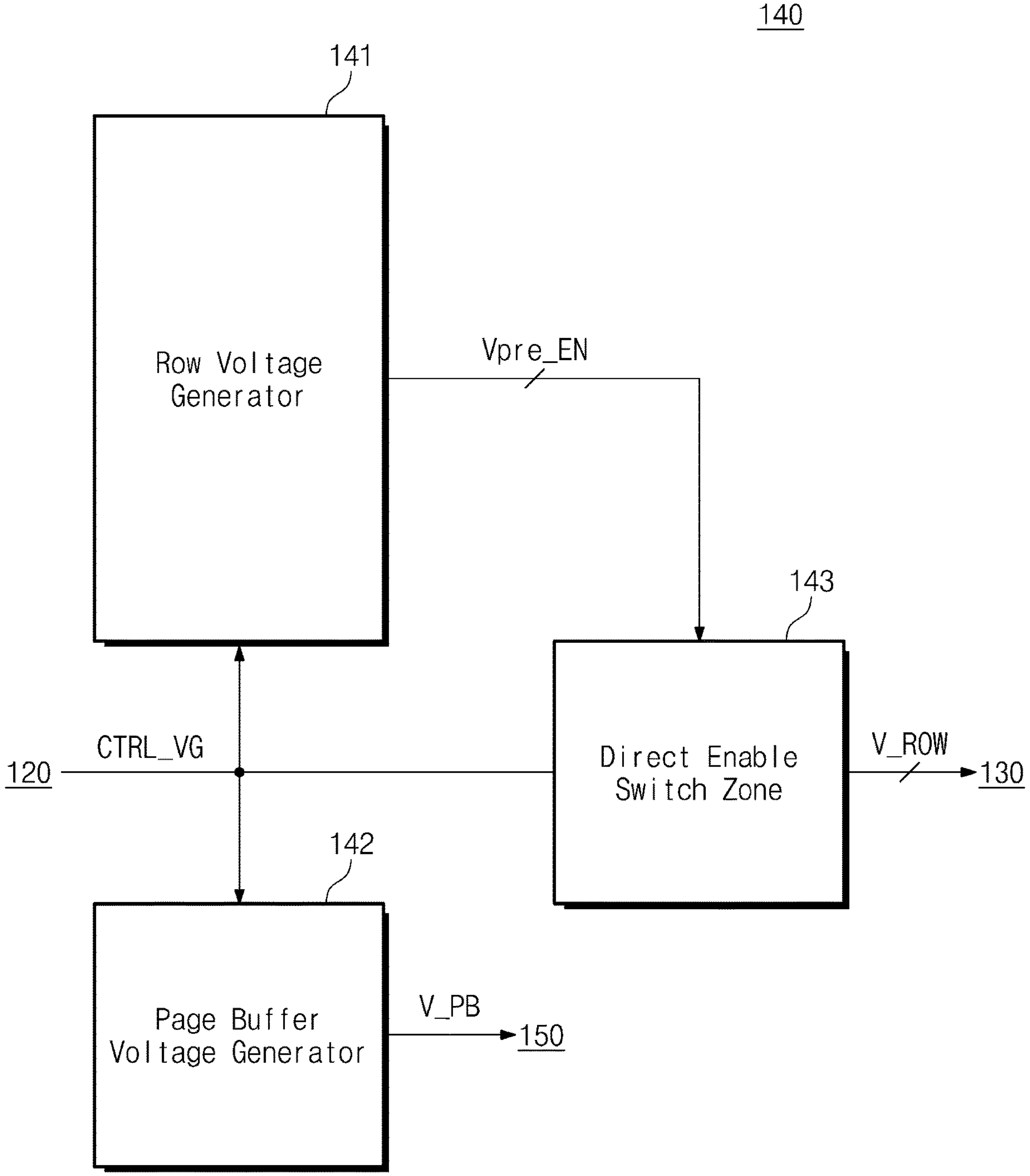
FIG. 13 is a diagram illustrating a voltage generator of FIG. 1 in detail, according to an implementation of the present disclosure.

FIG. 13 is a diagram illustrating the voltage generator 140 of FIG. 1 in detail, according to an implementation of the present disclosure. Referring to FIG. 13, the voltage generator 140 may include the row voltage generator 141, a page buffer voltage generator 142, and a direct enable switch zone 143. The voltage generator 140 of FIG. 1 according to an implementation of the present disclosure will be described with reference to FIG. 13.

Referring to FIG. 13, the row voltage generator 141 may operate in response to the voltage generator control signal CTRL_VG received from the control logic circuit 120. The row voltage generator 141 is described with reference to FIG. 1, and thus, additional description will be omitted to avoid redundancy.

The page buffer voltage generator 142 may generate a voltage necessary for the page buffer circuit 150 and may provide the generated voltage to the page buffer circuit 150. In some implementations, the page buffer voltage generator 142 may operate in response to the voltage generator control signal CTRL_VG received from the control logic circuit 120. For example, the page buffer voltage generator 142 may generate the page buffer voltages V_PB in response to the voltage generator control signal CTRL_VG so as to be provided to the page buffer circuit 150.

The direct enable switch zone 143 may be located between the row voltage generator 141 and the address decoder 130. In some implementations, the direct enable switch zone 131 may operate under control of the control logic circuit 120. For example, the direct enable switch zone 143 may operate in response to the voltage generator control signal CTRL_VG received from the control logic circuit 120.

The direct enable switch zone 143 may transfer voltages Vpre_EN of the row voltage generator 141 to the address decoder 130. In some implementations, the number of voltages Vpre_EN that the direct enable switch zone 143 receives from the row voltage generator 141 may vary depending on an operation scheme of the non-volatile memory device 100.

The direct enable switch zone 143 may determine whether to transfer the voltages Vpre_EN to the address decoder 130. In some implementations, the direct enable switch zone 143 may inhibit at least one of the voltages Vpre_EN of the row voltage generator 141 from being transferred to the voltage moving zone 132. For example, referring to FIGS. 1, 2, 5, and 13, the direct enable switch zone 143 may inhibit one, which is provided to the selected wordline, from among the voltages Vpre_EN from being transferred to the address decoder 130 in the SO develop period from t53 to t54 such that the selected wordline is floated.

For another example, the direct enable switch zone 143 may allow one, which is provided to the selected wordline, from among the voltages Vpre_EN to be transferred to the address decoder 130 in the sensing period from t54 to t54 of FIG. 5 such that the voltage of the selected wordline changes to a next read voltage. The direct enable switch zone 143 will be described in detail with reference to FIGS. 14A and 14B.

Figure 14A:
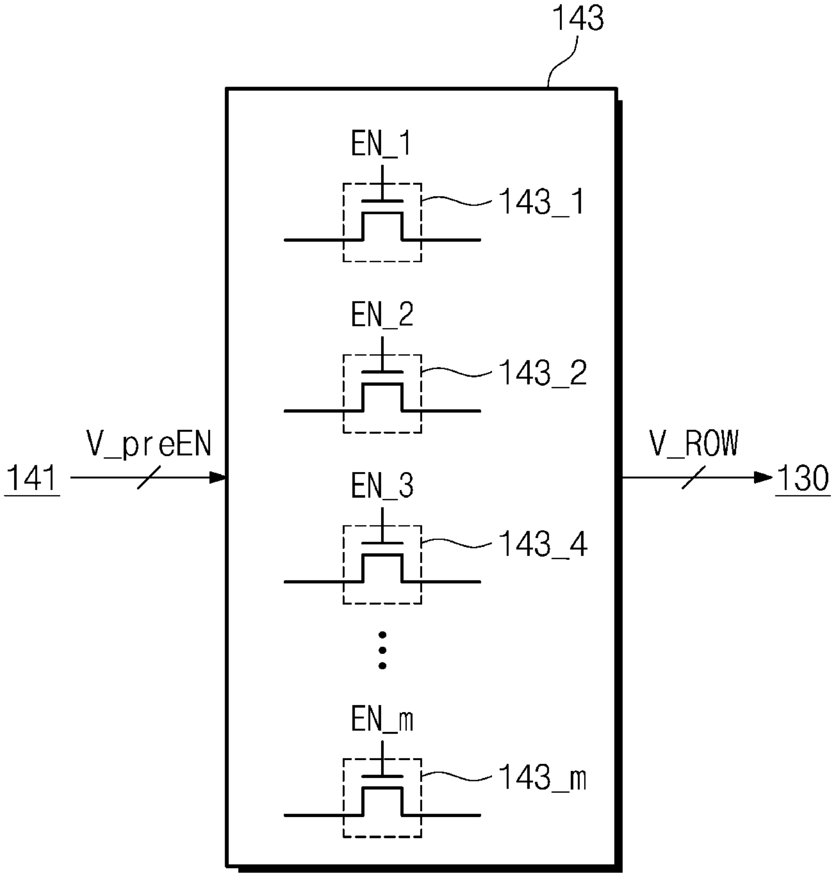
FIGS. 14A and 14B are diagrams illustrating a direct enable switch zone FIG. 13 in detail, according to an implementation of the present disclosure.
Figure 14B:
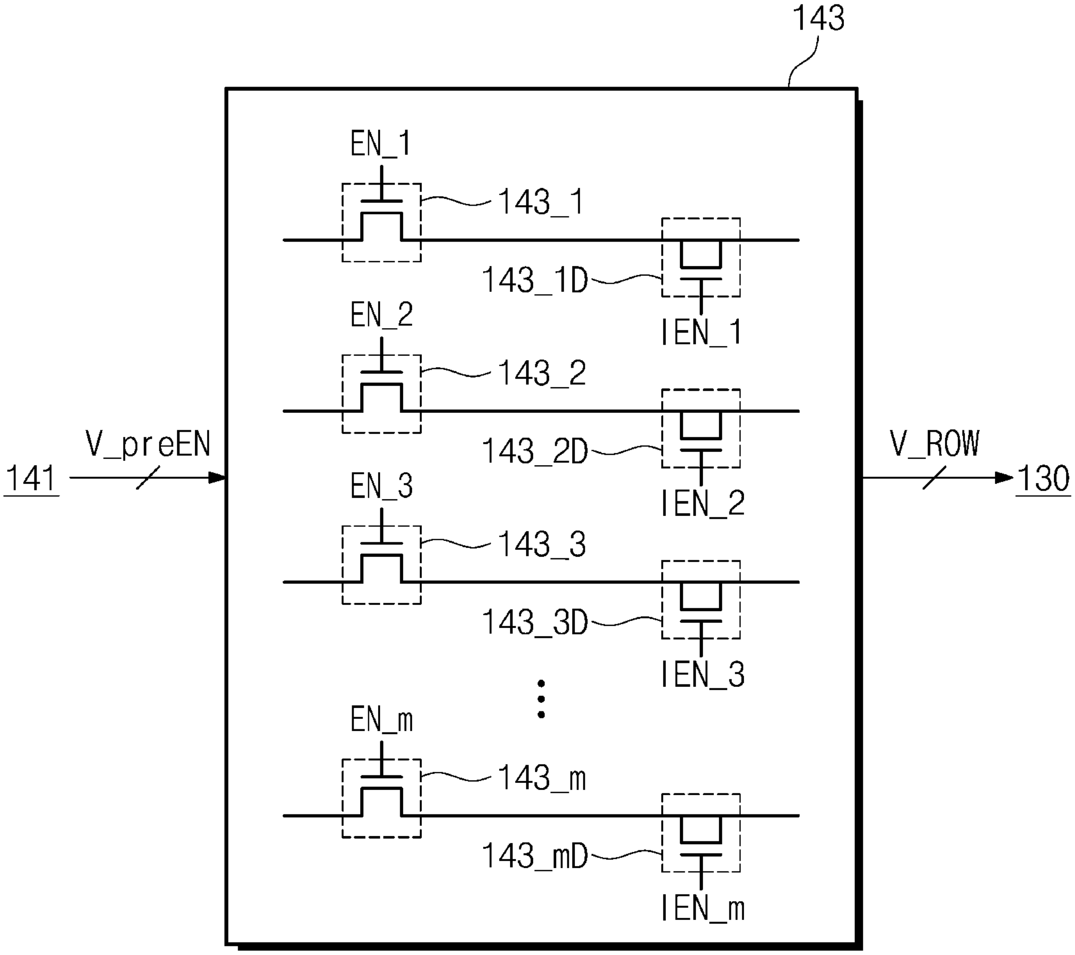

FIGS. 14A and 14B are diagrams illustrating the direct enable switch zone 143 of FIG. 13 in detail, according to an implementation of the present disclosure. The direct enable switch zone 143 will be described with reference to FIGS. 14A and 14B.

Referring to FIGS. 1, 11, and 14A, the direct enable switch zone 143 may include a plurality of direct enable switches 143_1 to 143_*m*. In some implementations, the plurality of direct enable switches 143_1 to 143_*m* may be connected between the row voltage generating units 141_1 to 141_*n*, 141_*s*, and 141_*g*, which are sub-components of the row voltage generator 141 of the voltage generator 140 of FIG. 1, and the address decoder 130.

In some implementations, the plurality of direct enable switches 143_1 to 143_*m* may be located only between the wordline voltage generating units 141_1 to 141_*n* and the address decoder 130. In this case, the direct enable switch zone 143 may control whether to transfer only wordline voltages and may transfer a string selecting voltage and a ground selecting voltage to the address decoder 130 without a control.

In some implementations, the plurality of direct enable switches 143_1 to 143_*m* may operate based on the corresponding enable signals EN_1 to EN_m. The plurality of enable signals EN_1 to EN_m may be generated based on the voltage generator control signal CTRL_VG. For example, the first direct enable switch 143_1 may be turned on or turned off in response to the first enable signal EN_1.

When the direct enable switches 143_1 to 143_*m* are turned on, opposite ends of each of the direct enable switches 143_1 to 143_*m* may have the same voltage. When the direct enable switches 143_1 to 143_*m* are turned off, opposite ends of each of the direct enable switches 143_1 to 143_*m* may have different voltages. That is, when one corresponding to a selected wordline from among the direct enable switches 143_1 to 143_*m* is turned off, the selected wordline may be floated.

In some implementations, the plurality of direct enable switches 143_1 to 143_*m* may respectively include MOSFETs (e.g., NMOS or PMOS transistors) that are connected between the row voltage generator 141 and the address decoder 130 and include gate nodes respectively receiving the enable signals EN_1 to EN_m. In some implementations, the number of direct enable switches 143_1 to 143_*m* may be determined based on the number of row voltage generating units 141_1 to 141_*n*, 141_*s*, and 141_*g* being sub-components of the voltage generator 140 or based on an operation scheme of the non-volatile memory device 100. For example, when the direct enable switches 143_1 to 143_*m* are respectively connected to the wordline voltage generating units 141_1 to 141_*n* and are not connected to the string selecting voltage generating unit 141_*s* and the ground selecting voltage generating unit 141_*g*, the number of direct enable switches 143_1 to 143_*m* may be equal to the number or wordline voltage generating units 141_1 to 141_*n*.

Referring to FIG. 14B, the direct enable switch zone 143 may include the plurality of direct enable switches 143_1 to 143_*m* and a plurality of decoupling switches 143_1D to 143_mD. Referring to FIGS. 1, 11, and 14B, the plurality of direct enable switches 143_1 to 143_*m* may be connected between the row voltage generator 141 and the plurality of decoupling switches 143_1D to 143_mD corresponding thereto.

The plurality of decoupling switches 143_1D to 143_mD may be connected between the plurality of direct enable switches 143_1 to 143_*m* and the address decoder 130. In some implementations, as well as a switch, a connection means may be present between opposite ends of each of the plurality of decoupling switches 143_1D to 143_mD. For example, the opposite ends of each of the plurality of decoupling switches 143_1D to 143_mD may be connected by a conductive line. That is, even though the decoupling switches 143_1D to 143_mD are turned off, the opposite ends of each of the decoupling switches 131_1D to 131_mD may have the same potential.

The decoupling switches 143_1D to 143_mD may operate based on inverse enable signals IEN_1 to IEN_m corresponding thereto. In some implementations, the inverse enable signals IEN_1 to IEN_m may be inverse signals of the enable signals EN_1 to EN_m. For example, the inverse enable signals IEN_1 to IEN_m may be inverse signals whose phases are opposite to those of the enable signals EN_1 to EN_m. When the decoupling switches 143_1D to 143_mD are turned on, voltages that are provided to the memory cell array 110 may be prevented from finely changing due to the operation of the direct enable switches 143_1 to 143_*m*.

In some implementations, the decoupling switches 143_1D to 143_mD may include MOSFETs (e.g., NMOS or PMOS transistors) that are connected between the corresponding direct enable switches 143_1 to 143_*m* and the address decoder 130 and include gate nodes respectively receiving the corresponding inverse enable signals IEN_1 to IEN_m. In some implementations, the number of decoupling switches 143_1D to 143_mD may be equal to the number of direct enable switches 143_1 to 143_*m*.

According to the implementations of the present disclosure described above, the non-volatile memory device 100 may float a selected wordline in the SO develop process and may in advance change the voltage of the selected wordline to a next voltage to be supplied to the selected wordline, and thus, a total read speed may be improved.

According to the present disclosure, a method and a device capable of shortening an operation time of a non-volatile memory device are provided.

While this specification contains many specific implementation details, these should not be construed as limitations on the scope of what may be claimed, but rather as descriptions of features that may be specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a subcombination.

While the present disclosure has been described with reference to implementations thereof, it will be apparent to those of ordinary skill in the art that various changes and modifications may be made thereto without departing from the spirit and scope of the present disclosure as set forth in the following claims.

What is claimed is:

1. A read operation method of a non-volatile memory device, the method comprising:

applying a first read voltage to a selected wordline, the first read voltage being generated from a voltage generator;

performing a first sensing node develop operation associated with the first read voltage in a first sensing node develop period;

performing a first sensing operation associated with the first read voltage; and generating, using the voltage generator in the first sensing node develop period, a second read voltage based on the first sensing node develop operation being performed and the selected wordline being disconnected from the voltage generator and thereby being floated.

2. The method of claim 1, wherein, during the first sensing operation, the second read voltage is applied to the selected wordline by connecting the voltage generator to the selected wordline.

3. The method of claim 2, further comprising:

performing a bitline precharge operation associated with the second read voltage;

performing a second sensing node develop operation associated with the second read voltage; and performing a second sensing operation associated with the second read voltage.

4. The method of claim 3, wherein the voltage generator is configured to generate a third read voltage based on the second sensing node develop operation being performed and the selected wordline being disconnected from the voltage generator and thereby being floated, and wherein, during the second sensing operation, the third read voltage is applied to the selected wordline by connecting the voltage generator to the selected wordline.

5. The method of claim 1, wherein applying the first read voltage includes:

performing a bitline precharge operation associated with the first read voltage; and performing a dump close operation.

6. The method of claim 1, wherein disconnecting the selected wordline from the voltage generator is performed by turning off a direct enable switch located between the selected wordline and the voltage generator.

7. The method of claim 6, wherein a decoupling switch is provided between the selected wordline and the voltage generator, and wherein a change in a voltage of the selected wordline due to an operation of the direct enable switch is configured to be prevented based on the decoupling switching being turned on.

8. The method of claim 7, wherein the direct enable switch operates based on an enable signal, and wherein the enable signal is generated by a control logic circuit, the control logic circuit being configured to control an operation of the non-volatile memory device.

9. The method of claim 8, wherein the decoupling switch operates based on a signal having a phase opposite to a phase of the enable signal.

10. A non-volatile memory device comprising:

a memory cell array configured to store data;

a voltage generator configured to generate first voltages used to operate the memory cell array; and a plurality of direct enable switches located between the memory cell array and the voltage generator, wherein, based on a sensing node develop operation being performed in a first sensing node develop period and associated with a first read voltage, the plurality of direct enable switches are configured to disconnect a selected wordline among a plurality of wordlines of the memory cell array from the voltage generator, and the voltage generator is configured to generate, in the first sensing node develop period, a second read voltage to be provided to the memory cell array.

11. The non-volatile memory device of claim 10, wherein the plurality of direct enable switches are configured to, based on a sensing operation being performed and associated with the first read voltage, connect the selected wordline to the voltage generator such that the second read voltage is applied to the selected wordline.

12. The non-volatile memory device of claim 11, wherein, based on a sensing node develop operation associated with the second read voltage being performed, the plurality of direct enable switches are configured to disconnect the selected wordline from the voltage generator, and the voltage generator is configured to generate a third read voltage to be provided to the memory cell array.

13. The non-volatile memory device of claim 10, comprising:

a plurality of decoupling switches between the plurality of direct enable switches and the memory cell array, wherein the plurality of decoupling switches are configured to prevent a voltage change of the plurality of wordlines based on an operation of the plurality of direct enable switches.

14. The non-volatile memory device of claim 10, wherein the voltage generator includes:

a row voltage generator configured to generate the first voltages to be provided to the memory cell array;

a page buffer voltage generator configured to generate a second voltage to be provided to a page buffer circuit; and wherein the plurality of direct enable switches are located between the row voltage generator and the memory cell array.

15. The non-volatile memory device of claim 14, wherein the voltage generator includes:

a plurality of decoupling switches between the plurality of direct enable switches and the memory cell array, and wherein the plurality of decoupling switches are configured to prevent a voltage change of the plurality of wordlines of the memory cell array.

16. The non-volatile memory device of claim 10, further comprising:

an address decoder configured to distribute the first voltages to the plurality of wordlines between the memory cell array and the voltage generator, wherein the address decoder includes:

the plurality of direct enable switches; and a decoding zone configured to distribute the first voltages to the plurality of wordlines, and wherein the plurality of direct enable switches are configured to receive the first voltages from the voltage generator and to transfer the first voltages to the decoding zone.

17. The non-volatile memory device of claim 16, further comprising:

a plurality of decoupling switches between the plurality of direct enable switches and the decoding zone, wherein the plurality of decoupling switches are configured to prevent a voltage change of the plurality of wordlines based on an operation of the plurality of direct enable switches.

18. A verify operation method of a non-volatile memory device, the method comprising:

applying a first verify voltage to a selected wordline, the first verify voltage being generated from a voltage generator;

performing a first sensing node develop operation associated with the first verify voltage;

performing a first sensing operation associated with the first verify voltage;

performing a second sensing operation associated with the first verify voltage; and generating, using the voltage generator, a second verify voltage based on the first sensing node develop operation being performed and the selected wordline being disconnected from the voltage generator and thereby being floated.

19. The method of claim 18, wherein, during the second sensing operation, the second verify voltage is applied to the selected wordline by connecting the voltage generator to the selected wordline.

20. The method of claim 18, wherein disconnecting the selected wordline from the voltage generator is performed by turning off a direct enable switch located between the selected wordline and the voltage generator.

* * * * *